United States Patent
Hashimoto et al.

(10) Patent No.: US 9,343,341 B2
(45) Date of Patent: May 17, 2016

(54) END EFFECTOR DEVICE AND SUBSTRATE CONVEYING ROBOT INCLUDING END EFFECTOR DEVICE

(75) Inventors: Yasuhiko Hashimoto, Kobe (JP); Shigeki Ono, Kobe (JP); Takayuki Fukushima, Takarazuka (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 14/235,115

(22) PCT Filed: Aug. 9, 2012

(86) PCT No.: PCT/JP2012/005059
§ 371 (c)(1),
(2), (4) Date: Apr. 2, 2014

(87) PCT Pub. No.: WO2013/021645
PCT Pub. Date: Feb. 14, 2013

(65) Prior Publication Data
US 2014/0210224 A1 Jul. 31, 2014

(30) Foreign Application Priority Data

Aug. 10, 2011 (JP) .................................. 2011-174875
Dec. 28, 2011 (JP) .................................. 2011-287565

(51) Int. Cl.
*H01L 21/68* (2006.01)
*H01L 21/677* (2006.01)
*H01L 21/687* (2006.01)

(52) U.S. Cl.
CPC ........ *H01L 21/677* (2013.01); *H01L 21/67742* (2013.01); *H01L 21/67766* (2013.01); *H01L 21/67781* (2013.01); *H01L 21/68707* (2013.01)

(58) Field of Classification Search
CPC ............ H01L 21/677; H01L 21/67766; H01L 21/67742; H01L 21/68707; H01L 21/67718; H01L 21/67754; H01L 21/67781; B25J 11/0095

USPC ......... 414/416.02, 749.5, 941; 294/87.1, 213; 198/468.3
See application file for complete search history.

(56) References Cited

U.S. PATENT DOCUMENTS 4,597,819 A * 7/1986 Kusuhara et al. ......... 156/345.54
5,273,244 A * 12/1993 Ono ........................... 248/176.3
(Continued)

FOREIGN PATENT DOCUMENTS

EP    1 780 784 A2    5/2007
JP    A-5-235147      9/1993
(Continued)

OTHER PUBLICATIONS

International Search Report issued in International Patent Application No. PCT/JP2012/005059 mailed Sep. 18, 2012.
(Continued)

*Primary Examiner* — Dean Kramer
(74) *Attorney, Agent, or Firm* — Oliff PLC

(57) ABSTRACT

An end effector device attached to a tip end portion of a robot arm includes a plurality of support units provided on a blade. Each of the support units includes: a plurality of nail pieces configured to support peripheral portions of a plurality of semiconductor wafers such that the semiconductor wafers are parallel to one another and spaced apart from one another; and a pitch changing mechanism configured to change upper-lower intervals of the nail pieces. The pitch changing mechanism includes: a coil spring configured to support the plurality of nail pieces such that the plurality of nail pieces are spaced apart from one another in an upper-lower direction and elastically deform in the upper-lower direction; and an operating mechanism configured to cause the coil spring to elastically deform in the upper-lower direction. The operating mechanism includes a piston pin fitted in the coil spring to move up and down.

25 Claims, 33 Drawing Sheets

(56) References Cited

U.S. PATENT DOCUMENTS

| | | | |
|---|---|---|---|
| 5,655,871 A * | 8/1997 | Ishii et al. | 414/416.02 |
| 2001/0048867 A1 * | 12/2001 | Lebar et al. | 414/217 |
| 2008/0105201 A1 | 5/2008 | Ronan et al. | |
| 2008/0216880 A1 | 9/2008 | Shiomi et al. | |

FOREIGN PATENT DOCUMENTS

| | | |
|---|---|---|
| JP | A-11-163096 | 6/1999 |
| JP | B2-2925329 | 7/1999 |
| JP | A-2001-118909 | 4/2001 |
| JP | A-2001-179672 | 7/2001 |
| JP | A-2001-291759 | 10/2001 |
| JP | A-2003-309166 | 10/2003 |
| JP | A-2005-340729 | 12/2005 |
| WO | WO 96/12294 A1 | 4/1996 |

OTHER PUBLICATIONS

May 6, 2015 Search Report issued in European Application No. 12822878.0.

* cited by examiner

END EFFECTOR DEVICE AND SUBSTRATE CONVEYING ROBOT INCLUDING END EFFECTOR DEVICE

TECHNICAL FIELD

The present invention relates to: an end effector device including a pitch changing mechanism and attached to a tip end portion of a robot arm, the pitch changing mechanism being capable of changing upper-lower intervals of plate-shaped members, more specifically, upper-lower intervals of a plurality of semiconductor wafers used in a semiconductor manufacturing process; a substrate conveying robot including the end effector device; a substrate processing device including the substrate conveying robot; and a substrate processing facility including the substrate processing device.

BACKGROUND ART

A semiconductor manufacturing process includes a step of conveying a plurality of semiconductor wafers at once from a foup that houses the plurality of semiconductor wafers lined up in an upper-lower direction to a processing shelf in which the semiconductor wafers are subjected to predetermined processing. While the semiconductor wafers are being conveyed, the upper-lower interval (hereinafter referred to as a "pitch") between the adjacent semiconductor wafers may be changed. A pitch changing mechanism is used to change this pitch.

A conventional pitch changing mechanism includes: a plurality of wafer holding trays each configured to receive the entire lower surface of the semiconductor wafer; and vertical shafts respectively provided at base end portions of the wafer holding trays (see PTL 1). Each of the wafer holding trays moves up and down along the vertical shaft and rotates around the vertical shaft in a horizontal plane. The wafer holding trays of the pitch changing mechanism hold the entire lower surfaces of the plurality of semiconductor wafers at a position opposed to the foup to take out the plurality of semiconductor wafers at once. After the pitch changing mechanism has moved in a horizontal direction, the wafer holding trays move down, so that the pitch between the adjacent semiconductor wafers is shortened. Next, the wafer holding trays rotate around the vertical shafts to house all the semiconductor wafers in the processing shelf.

CITATION LIST

Patent Literature

PTL 1: Japanese Laid-Open Patent Application Publication No. HEI.5-235147

SUMMARY OF INVENTION

Technical Problem

The applicants have thought of attaching the end effector device incorporating the pitch changing mechanism to the tip end portion of the robot arm to smoothly transfer the semiconductor wafers from the foup to a processing booth. However, the conventional pitch changing mechanism is large since the wafer holding tray receives the entire lower surface of the semiconductor wafer. Therefore, the conventional pitch changing mechanism is unsuitable for the incorporation into the end effector device.

An object of the present invention is to provide an end effector device including a mechanism configured to change an interval between semiconductor wafers.

Solution to Problem

The present invention is an end effector device attached to a tip end portion of a robot arm, the end effector device including: a blade including a base end portion and a tip end portion; and a support unit provided at the blade and configured to support peripheral portions of a plurality of plate-shaped members such that the plate-shaped members are parallel to one another and spaced apart from one another in an upper-lower direction and also configured to change intervals of the plate-shaped members. Here, the wording "provided so as to be located at the blade" includes both a case where the support unit is directly provided at the blade and a case where the support unit is provided at a portion of the end effector device other than the blade in a manner similar to the above case.

According to the present invention, a peripheral portion of the plate-shaped member is supported by the support unit. To be specific, since the support unit does not have to receive the entire surface of the plate-shaped member, a portion where the support unit supports the plate-shaped member can be reduced in size. With this, the support unit configured to change the intervals of the plate-shaped members can be reduced in size so as to be suitable for the incorporation into the end effector device. In the present application, the reduction in size also denotes that the size reduction that has been conventionally impossible is realized. That is, the reduction in size in the present application does not just means the size reduction.

In the above end effector device, a plurality of pitch changing mechanisms are provided at the blade, each of the plurality of pitch changing mechanisms includes holding portions, which are provided so as to be spaced apart from one another in a direction perpendicular to axes of the holding portions, each of the axes extending in one flat plane, and are configured to respectively hold peripheral portions of the plurality of plate-shaped members, each of the plurality of pitch changing mechanisms changes intervals of the plurality of plate-shaped members, the intervals being formed in a direction perpendicular to the one flat plane, at least one of the pitch changing mechanisms is provided at the support unit and is configured to move forward to the tip end portion of the blade and move backward to the base end portion of the blade, and the one of the pitch changing mechanisms holds the plate-shaped members at a position where the one of the pitch changing mechanisms has moved forward to the tip end portion of the blade and cancels the holding of the plate-shaped members at a position where the one of the pitch changing mechanisms has moved backward to the base end portion of the blade.

According to the present invention, when one pitch changing mechanism moves backward, the holding of the plate-shaped members by the holding portions of this pitch changing mechanism is cancelled. With this, the plurality of plate-shaped members whose intervals have been changed can be easily passed to the next processing stage. In the following explanation, a configuration in which the pitch changing mechanism presses the peripheral portion of the plate-shaped member in a direction connecting the base end and tip end of the blade to hold the plate-shaped member is called an edge grip type.

Advantageous Effects of Invention

In the present invention, the incorporated support unit has a pitch changing function and supports the peripheral portions of the plate-shaped members. With this, a mechanism configured to change the pitches in the end effector device can be reduced in size.

BRIEF DESCRIPTION OF DRAWINGS

FIG. 7A shows an initial state where the pitches are large, and FIG. 7B shows a state where the pitches are small.

FIG. 9A shows an initial state where the pitches are large, and FIG. 9B shows a state where the pitches are small.

FIG. 10A shows an initial state where the pitches are large, and FIG. 10B shows a state where the pitches are small.

FIG. 12A shows an initial state where the pitches are large, and FIG. 12B shows a state where the pitches are small.

FIG. 14A shows an initial state where the pitches are large, and FIG. 14B shows a state where the pitches are small.

FIG. 15A shows an initial state where the pitches are large, and FIG. 15B shows a state where the pitches are small.

FIG. 16A shows an initial state where the pitches are large, and FIG. 16B shows a state where the pitches are small.

FIG. 17A shows an initial state where the pitches are large, and FIG. 17B shows a state where the pitches are small.

FIG. 20A shows an initial state where the pitches are large, and FIG. 20B shows a state where the pitches are small.

FIG. 21A shows an initial state where the pitches are large, and FIG. 21B shows a state where the pitches are small.

FIG. 22A shows an initial state where the pitches are large, and FIG. 22B shows a state where the pitches are small.

FIG. 23A shows an initial state where the pitches are large, and FIG. 23B shows a state where the pitches are small.

FIG. 25A shows an initial state where the pitches are large, and FIG. 25B shows a state where the pitches are small.

DESCRIPTION OF EMBODIMENTS

Embodiment 1 of End Effector Device

Hereinafter, one embodiment of the present invention will be explained in detail in reference to the drawings. The present invention relates to an end effector device attached to a tip end portion of an arm of a substrate conveying robot. First, the conveying robot will be explained wholly. In the embodiments of the present invention, a horizontal plane is used as one example of "one flat plane" in the present invention. In addition, a circular plate-shaped semiconductor wafer is used as one example of a plate-shaped member conveyed by the conveying robot. However, the plate-shaped member is not limited to the semiconductor wafer. For example, the plate-shaped member may be a glass substrate processed in a semiconductor process and used for a thin liquid crystal display or an organic EL display. The semiconductor wafer is a substrate material of a semiconductor device, and examples thereof include a silicon wafer, a silicon carbide wafer, and a sapphire wafer. Further, the semiconductor wafer does not have to be a material, and a circuit and/or a structure may be formed on the plate-shaped member. The shape of the semiconductor wafer is not limited to a circular shape.

Examples of the processing of the semiconductor wafer include a heat treatment and film formation performed in a processing booth. A plurality of semiconductor wafers before the processing are housed in a foup (Front Opening Unified Pod), located away from the processing booth, such that each of the semiconductor wafers is in a horizontal posture, and the semiconductor wafers are lined up in an upper-lower direction.

A processing shelf for semiconductor wafer processing is provided in the processing booth. The processing shelf holds a plurality of semiconductor wafers such that each of the semiconductor wafers is in a horizontal posture, and the semiconductor wafers are lined up in the upper-lower direction. At the time of the processing, a plurality of semiconductor wafers are taken out from the foup at once to be conveyed to the processing shelf. Here, the pitch between the adjacent semiconductor wafers in the processing shelf is different from the pitch between the adjacent semiconductor wafers in the foup in some cases. Specifically, the pitch in the processing shelf is shorter than the pitch in the foup in some cases. In such a case, used is a pitch changing mechanism configured to take out the plurality of semiconductor wafers from the foup and change the pitches while the plurality of semiconductor wafers are being conveyed to the processing shelf. This is the same as conventional cases.

Components for housing the semiconductor wafers are not limited to the foup and the processing shelf. To be specific, any components may be used as long as the semiconductor wafers are housed in the components such that the pitches of the semiconductor wafers in one of the components are different from those of the semiconductor wafers in the other component.

Figure 1:
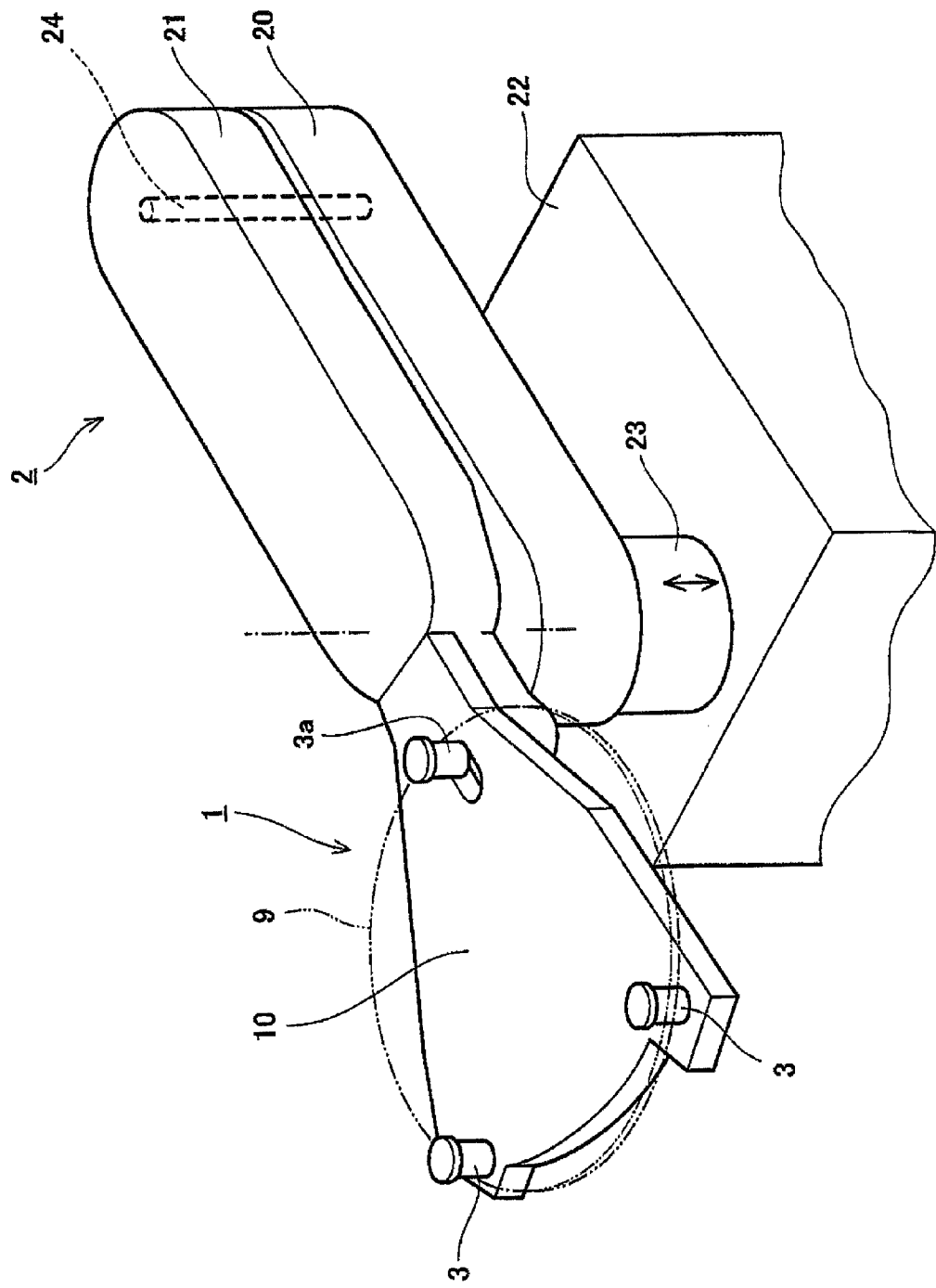
FIG. 1 is a perspective view of an entire substrate conveying robot.

FIG. 1 is a perspective view of an entire substrate conveying robot 2. The substrate conveying robot 2 is a robot configured to convey a plurality of semiconductor wafers lined up in the upper-lower direction. One example of the substrate conveying robot 2 is a so-called horizontally articulated three-axis robot. The substrate conveying robot 2 is configured such that: an arm supporting portion 23 capable of moving up and down is provided on a base 22 fixed to a semiconductor processing equipment; and one end portion of a first arm 20 extending in a horizontal direction is attached to an upper end portion of the arm supporting portion 23. The first arm 20 is provided so as to be rotatable relative to the arm supporting portion 23, and one end portion of a second arm 21 is pivotally supported by the other end portion of the first arm 20.

A below-described end effector device 1 is attached to a terminal end portion of the second arm 21. Since the first arm 20 rotates relative to the arm supporting portion 23, and the second arm 21 rotates relative to the first arm 20 in the horizontal plane, the end effector device 1 moves in the horizontal plane. The end effector device can move in a height direction by the upward and downward movements of the arm supporting portion 23.

The substrate conveying robot 2 may be included in a substrate processing device. The substrate processing device may be included in a substrate processing facility. The substrate processing device and the substrate processing facility will be described later.

The end effector device 1 includes: a blade 10 having a base end portion attached to a tip end portion of the second arm 21; and a plurality of support units extending upward from the blade 10 (for example, in FIG. 1, three support units 3, 3, and 3a). The support units 3 and 3a hold a plurality of semiconductor wafers 9 such that each of the semiconductor wafers 9 is in a horizontal posture, the semiconductor wafers 9 are spaced apart from one another in the upper-lower direction. The end effector device 1 configured such that the support units 3 are provided on the lower surface of the blade 10 or on both upper and lower surfaces of the blade 10 is also included in the technical scope of the present invention. However, for convenience of explanation, in the following example, the support units 3 extend upward from the blade 10.

Figure 2:
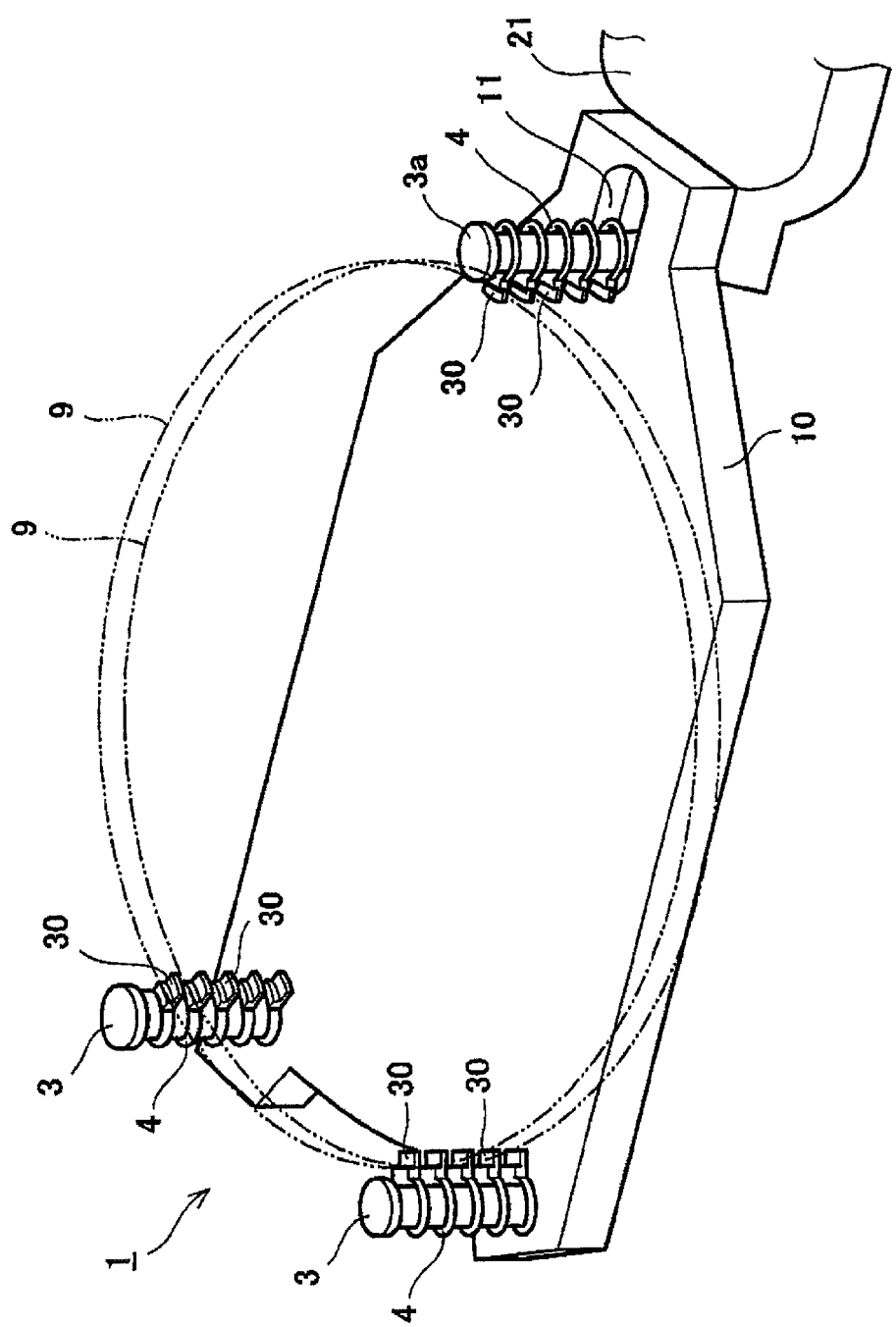
FIG. 2 is an enlarged perspective view of the end effector device.
Figure 3:
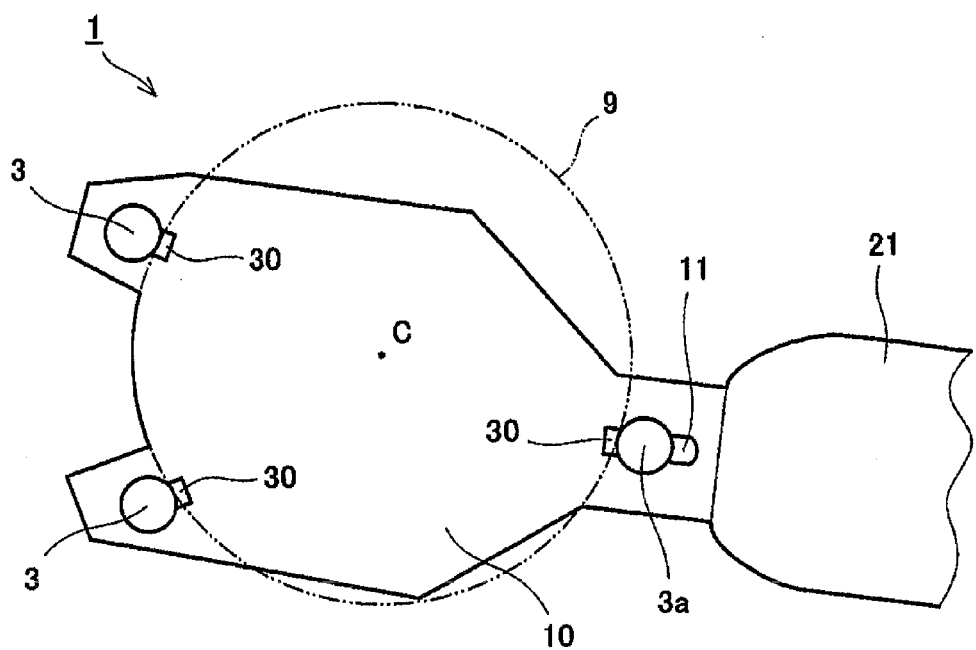
FIG. 3 is a plan view of the end effector device shown in FIG. 2.

FIG. 2 is an enlarged perspective view of the end effector device 1, and FIG. 3 is a plan view of the end effector device 1. Two of the three support units 3, 3, and 3a are tip end support units 3 located at a tip end portion of the blade 10, and the other is a base end support unit 3a located at the base end portion of the blade 10. An elongated hole 11 extending from the base end portion of the blade 10 toward the tip end side is formed on the base end portion of the blade 10. The base end support unit 3a is provided on the tip end portion of the second arm 21 to project upward from the blade 10 through the elongated hole 11. This configuration in which the base end support unit 3a is provided on the tip end portion of the second arm 21 to project upward from the blade 10 through the elongated hole 11 is also included in the configuration in which "the base end support unit 3a is provided so as to be located at the blade 10". The base end support unit 3a moves on the tip end portion of the second arm 21 or on the blade 10 by a plunger (not shown) provided at the second arm 21. Specifically, the base end support unit 3a moves between a forward position where the base end support unit 3a has moved toward the tip end of the blade 10 and a backward position where the base end support unit 3a has moved toward the base end portion of the blade 10 from the forward position.

For convenience of explanation, the above embodiment has explained a case where the tip end support units 3 are fixed to the blade 10, and the base end support unit 3a moves along the elongated hole 11. However, instead of this, one or both of the tip end support units 3 may be moved in a direction toward the center of the semiconductor wafer 9 or toward the base end portion of the blade 10. That is, the distance between the support units 3 may be shortened.

Each of the support units 3 and 3a includes: a plurality of nail pieces 30 arranged so as to be spaced apart from one another in the upper-lower direction and each configured to support a peripheral portion of the semiconductor wafer 9; and a pitch changing mechanism 4 configured to change upper-lower intervals of the plurality of nail pieces 30. Three nail pieces 30, located at the same height, of the support units 3 and 3a support the peripheral portion of one semiconductor wafer 9.

As shown in FIG. 3, the three nail pieces 30, located at the same height, of the support units 3 and 3a are arranged radially relative to a center C of the semiconductor wafer 9. Since the horizontal plane at which the semiconductor wafer 9 should be located is determined by the three nail pieces 30, the semiconductor wafer 9 is substantially horizontally, stably supported by the three nail pieces 30.

Figure 4:
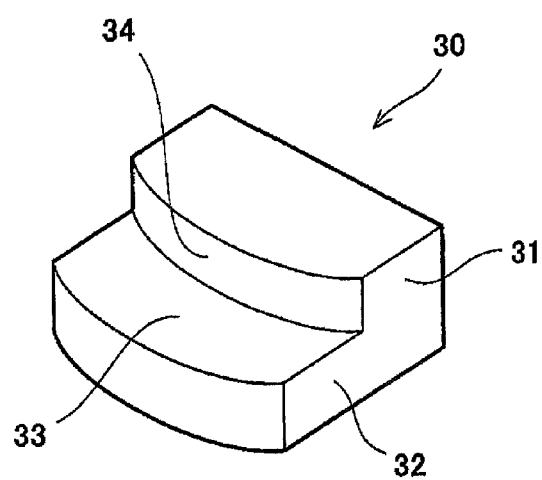
FIG. 4 is a perspective view of a nail piece.

FIG. 4 is a perspective view of the nail piece 30. The nail piece 30 is configured to have two stages such that a receiving piece 32 projects laterally from a lower end portion of a main body 31. An upper surface of the receiving piece 32 forms a receiving surface 33 that receives a lower surface of the peripheral portion of the semiconductor wafer 9. An inner side surface of the main body 31 forms a contact surface 34 that is substantially perpendicular to the receiving surface 33 and contacts a peripheral end surface of the semiconductor wafer 9. The nail piece 30 is made of synthetic resin. However, the present embodiment is not limited to this. It is preferable that the nail piece 30 be made of a material that does not damage the semiconductor wafer 9.

Figure 5:
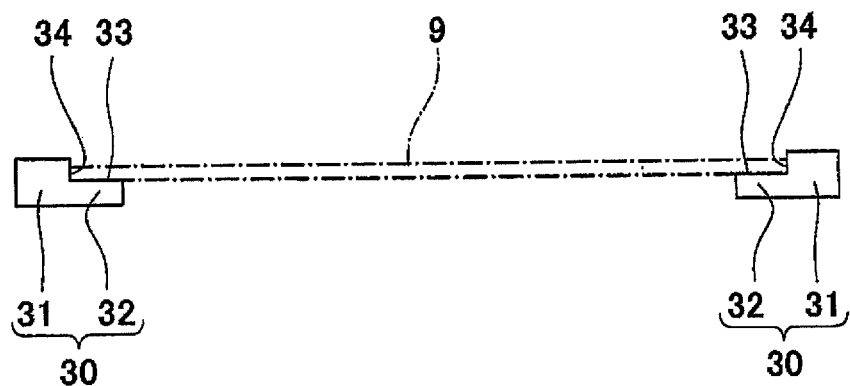
FIG. 5 is a side view showing a state where a semiconductor wafer is held by the nail pieces.

FIG. 5 is a side view showing a state where the semiconductor wafer 9 is held by the nail pieces 30. As described above, the nail piece 30 is the edge grip type that stably holds the semiconductor wafer 9 by causing the contact surfaces 34 to inwardly push the peripheral edge of the semiconductor wafer 9.

When the support unit 3a is located at the forward position, the nail pieces 30 located at the same height hold the semiconductor wafer 9. With this, the position of the semiconductor wafer 9 in the horizontal plane is stabilized. Further, even if the entire end effector device 1 is conveyed at high speed, the semiconductor wafer 9 is not displaced. As above, the edge grip type nail piece 30 is advantageous in that the semiconductor wafer 9 is stably held and conveyed. However, the nail piece 30 may have another configuration shown in FIG. 6.

Application Example of Nail Piece

Figure 6:
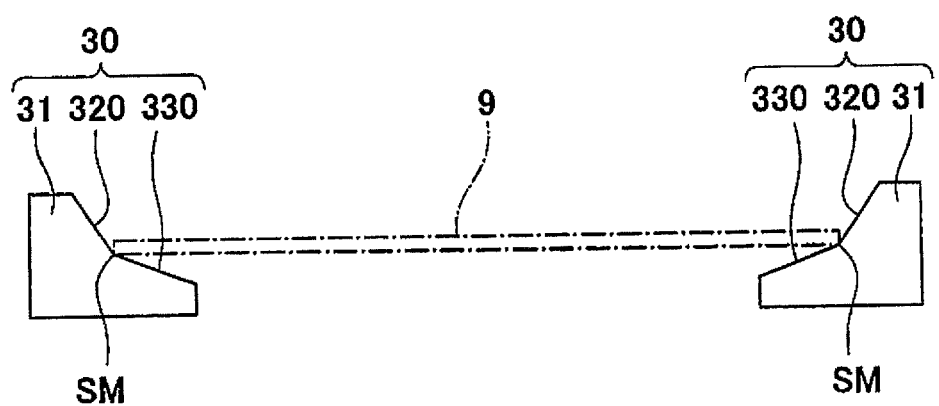
FIG. 6 is a diagram showing another type of nail pieces.

FIG. 6 is a side view showing another type of nail pieces 30. The nail piece 30 includes: a first oblique surface 320 that is inclined inward and downward from an upper end portion of the main body 31; and a second oblique surface 330 that is formed at a lower side of the first oblique surface 320, is continuous with the first oblique surface 32, is inclined inward and downward, and has an inclination angle smaller than that of the first oblique surface 32. The peripheral portion of the semiconductor wafer 9 is placed at and held by a boundary SM between the first oblique surface 320 and the second oblique surface 330 at an inner side of each nail piece 30.

According to this configuration, when the semiconductor wafer 9 is held by the nail piece 30, the semiconductor wafer 9 slides on the first oblique surface 320 of the nail piece 30 to be placed at the boundary SM between the first oblique surface 320 and the second oblique surface 330 of the nail piece 30. With this, the horizontal position and horizontal posture of the semiconductor wafer 9 relative to the pitch changing mechanism 4 are corrected, so that the semiconductor wafer 9 is stably held. Since the nail piece 30 and the semiconductor wafer 9 line-contact each other, an area of contact between the nail piece 30 and the semiconductor wafer 9 is small. With this, the adhesion of foreign matters to the semiconductor wafer 9 decreases.

Operations of End Effector Device

Step 1

The end effector device 1 is located at a position opposed to the foup that houses a plurality of semiconductor wafers 9 such that the semiconductor wafers 9 are spaced apart from one another in the upper-lower direction. A plurality of semiconductor wafers are transferred from the foup to the end effector device 1 by the substrate conveying robot 2 while maintaining a state where the semiconductor wafers are spaced apart from one another in the upper-lower direction. The base end support unit 3a moves from the backward position to the forward position by the plunger to hold the semiconductor wafers 9.

When the base end support unit 3a of FIG. 2 is located at the forward position, the receiving surface 33 of each nail piece 30 of the base end support unit 3a receives the lower surface of the peripheral portion of the semiconductor wafer 9, and the contact surface 34 of each nail piece 30 of the base end support unit 3a pushes the peripheral end surface of the semiconductor wafer 9 in a forward direction. The peripheral end surface of the semiconductor wafer 9 is pushed by the contact surfaces 34 of the nail pieces 30, located at the same height, of the tip end support units 3. Thus, the peripheral portion lower surface and peripheral end surface of the semiconductor wafer 9 are held by the three nail pieces 30 in the end effector device 1. To be specific, only a part of the lower surface of the peripheral portion of the semiconductor wafer 9 is received by the nail pieces 30, and the nail pieces 30 do not cover the entire lower surface of the semiconductor wafer 9.

Step 2

In this state, the first arm 20 and the second arm 21 (see FIG. 1) rotate, and the arm supporting portion 23 moves up and down. Thus, the plurality of semiconductor wafers 9 held by the end effector device 1 are conveyed to be in front of the processing shelf (not shown) in the processing booth for semiconductors. Supporting portions (not shown) each configured to receive the lower surface of the semiconductor wafer 9 are provided in the processing shelf.

Step 3

When the end effector device 1 has conveyed the plurality of semiconductor wafers 9 to the semiconductor processing booth, the supporting portions are moved so as to be respectively opposed to the lower surfaces of the semiconductor wafers 9, and then respectively contact lower surface exposed portions of the semiconductor wafers 9. When the base end support unit 3a has moved to the backward position, the receiving surfaces 33 of the nail pieces 30 of the base end support unit 3a are separated from the lower surfaces of the peripheral portions of the semiconductor wafers 9. Thus, the semiconductor wafers 9 are not supported by the nail pieces 30 any more. The plurality of semiconductor wafers 9 are supported by the supporting portions to be conveyed to the processing shelf in the processing booth. Then, the semiconductor wafers 9 are subjected to the heat treatment and/or the film formation. The arm supporting portion 23 moves up and down, and the first arm 20 and the second arm 21 rotate. Thus, the end effector device 1 returns to the position opposed to the foup.

As with conventional cases, while a plurality of semiconductor wafers are conveyed from the foup to the processing shelf of the processing booth, it is necessary to change the upper-lower interval between the adjacent semiconductor wafers, more specifically, it is necessary to reduce the upper-lower interval. As described above, the support unit 3 includes the pitch changing mechanism 4 configured to change the upper-lower intervals of the plurality of nail pieces 30. The following will explain various types of pitch changing mechanisms 4. For convenience of explanation, the pitch changing mechanism 4 of the tip end support unit 3 standing on the blade 10 will be explained. The same pitch changing mechanism 4 is provided at the base end support unit 3a.

Embodiment 1 of Pitch Changing Mechanism

Figure 7A:
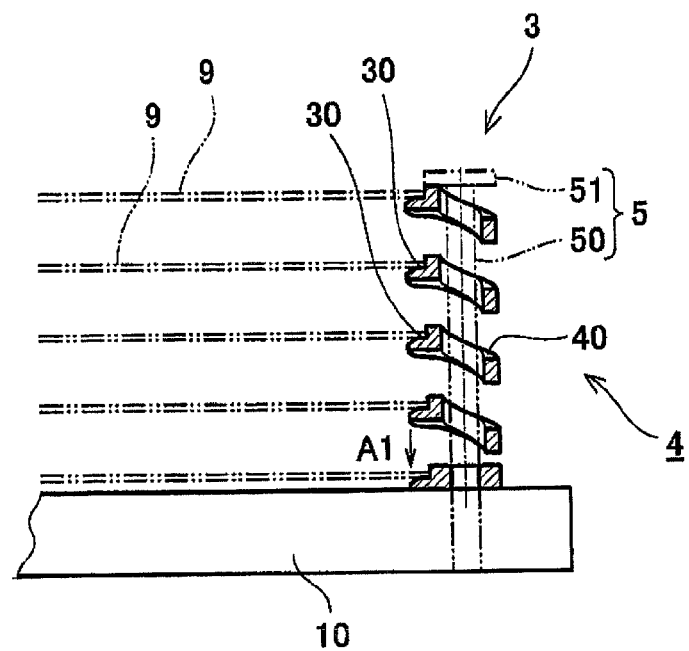
FIGS. 7A and 7B are partial cutaway views each showing a side surface of a pitch changing mechanism according to one embodiment.
Figure 7B:
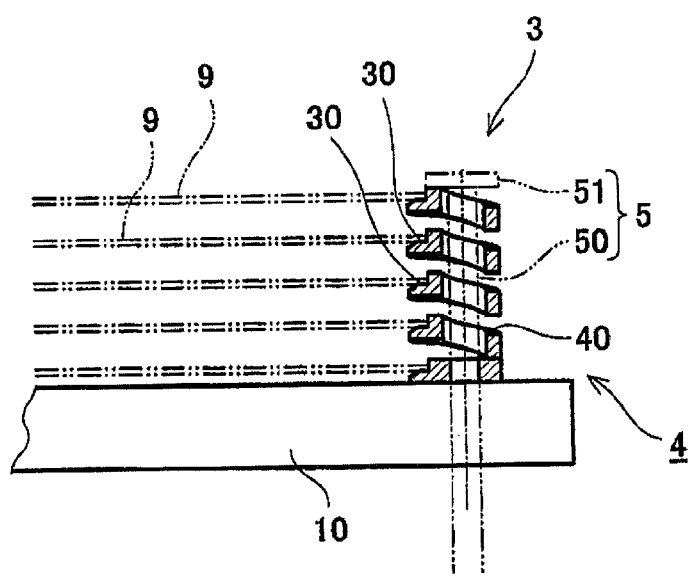

FIGS. 7A and 7B are partial cutaway views each showing a side surface of the pitch changing mechanism 4 according to Embodiment 1. FIG. 7A shows an initial state where the pitches are large, and FIG. 7B shows a state where the pitches are small.

A piston pin 50 having a circular cross section is provided on the blade 10 so as to be able to move up and down, and a flange 51 is attached to an upper end portion of the piston pin 50. A spiral coil spring 40 extending in the upper-lower direction is fitted on the piston pin 50 and is configured such that spring pitches thereof are equal to one another. The coil spring 40 is a single compression coil spring, and the plurality of nail pieces 30 are arranged at an outer peripheral portion of the coil spring 40 so as to be spaced apart from one another in the upper-lower direction such that a tip end portion of each nail piece 30 faces a center portion of the semiconductor wafer 9. Specifically, five nail pieces 30 are provided, and the nail piece 30 located at a lowest position contacts the blade 10 and does not move up or down. The other four nail pieces 30 move up and down. The number of nail pieces 30 is not limited to five.

While the pitch changing mechanism 4 in the initial state is conveyed to the processing booth, the intervals each between the adjacent nail pieces 30 are equally shortened from 10 mm to 6 mm. In the following explanation, the intervals are shortened by pushing down the nail pieces 30 located at higher positions. To be specific, the nail piece 30 located above and adjacent to the nail piece 30 located at the lowest position is pushed down by 4 mm, but the nail piece 30 located at the highest position is pushed down by 16 mm. A lowering distance of the nail piece 30 located at a higher position becomes larger. Of course, the intervals each between the nail pieces 30 may be shortened by pushing down the nail pieces 30 located at lower positions. Both pushing up and pushing down of the nail pieces 30 may be performed.

In the present embodiment, the piston pin 50 serves as a part of an operating mechanism 5 configured to cause the coil spring 40 to elastically deform in the upper-lower direction to change the intervals each between the adjacent nail pieces 30. One example of a mechanism configured to cause the piston pin 50 to move up and down is a mechanism configured such that the piston pin 50 is connected to a solenoid or an air cylinder.

In the initial state shown in FIG. 7A, the coil spring 40 is in a free length state or is being slightly pushed downward by the flange 51. The upper-lower interval between the adjacent nail pieces 30 is equal to one spring pitch, and the nail pieces 30 and the coil spring 40 are integrally made of synthetic resin. The nail piece 30 located at the highest position is in contact with a lower surface of the flange 51.

When the piston pin 50 moves down from the initial state shown in FIG. 7A, the flange 51 presses the coil spring 40 downward, and the coil spring 40 contracts against an elastic biasing force until the adjacent coils tightly contact each other. Since distances each between the adjacent pitches are shortened, the intervals each between the adjacent nail pieces 30 are also shortened. As described above, since the nail pieces 30 receive the lower surfaces of the peripheral portions of the semiconductor wafers 9, the intervals each between the semiconductor wafers 9 adjacent to each other in the upper-lower direction are also shortened. With this, the upper-lower intervals of the plurality of semiconductor wafers taken out from the foup are shortened, and the plurality of semiconductor wafers are transferred to the processing booth. After the plurality of semiconductor wafers are taken out in the processing booth, the end effector device 1 including the pitch changing mechanism 4 returns to the position opposed to the foup. At this time, the piston pin 50 moves up from the state shown in FIG. 7B to the state shown in FIG. 7A. The coil spring 40 expands upward by an elastic returning force. Thus, the upper-lower intervals each between the adjacent nail pieces 30 increase, and the pitch changing mechanism 4 returns to the initial state. To be specific, even though the piston pin 50 does not pull up the coil spring 40, the coil spring 40 returns to the initial state. Of course, the present embodiment may be configured such that the coil spring 40 is attached to the flange 51 and is pulled up by the piston pin 50.

Here, since the piston pin 50 has the circular cross section, there is a possibility that the coil spring 40 and the nail pieces 30 unexpectedly rotate around the piston pin 50. In this case, there is a possibility that the nail pieces 3 rotate so as to be away from the lower surface of the semiconductor wafer 9 and therefore cannot receive the semiconductor wafer 9. In consideration of this, a component for rotation stop is provided on the blade 10 as shown in FIG. 8.

Figure 8:
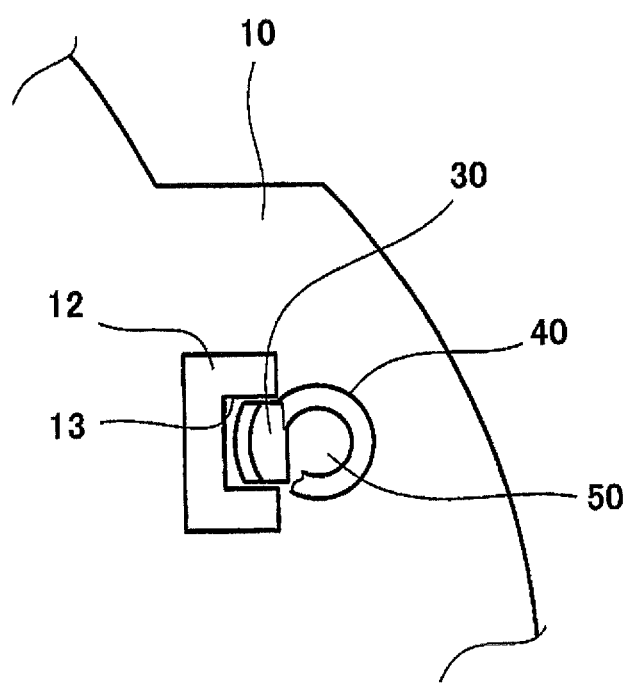
FIG. 8 is a plan view of the nail piece located at a lowest position when viewed from a direction A1 of FIG. 7A.

FIG. 8 is a plan view of the nail piece 30 located at the lowest position when viewed from a direction A1 shown in FIG. 7A. A rotation stop piece 12 is provided on the blade 10 so as to surround the nail piece 30 located at the lowest position, and the nail piece 30 located at the lowers position is fitted in a concave 13 of the rotation stop piece 12. A side portion of the nail piece 30 contacts an inner side wall of the concave 13, so that the nail piece 30 located at the lowest position is prevented from unexpectedly rotating around the piston pin 50. Since the nail pieces 30 and the coil spring 40 are formed integrally, the rotation of the coil spring 40 around the piston pin 50 is also prevented.

The nail pieces 30 support only a part of the lower surface of the peripheral portion of the semiconductor wafer 9 and does not cover the entire lower surface of the semiconductor wafer 9. Therefore, the pitch changing mechanism 4 can be made smaller and lighter than a conventional pitch changing mechanism 4 configured to support the entire lower surface of the semiconductor wafer 9. Therefore, the pitch changing mechanism 4 is suitably incorporated in the end effector device 1 attached to the tip end portion of the robot arm.

Embodiment 2 of Pitch Changing Mechanism

Figure 9A:
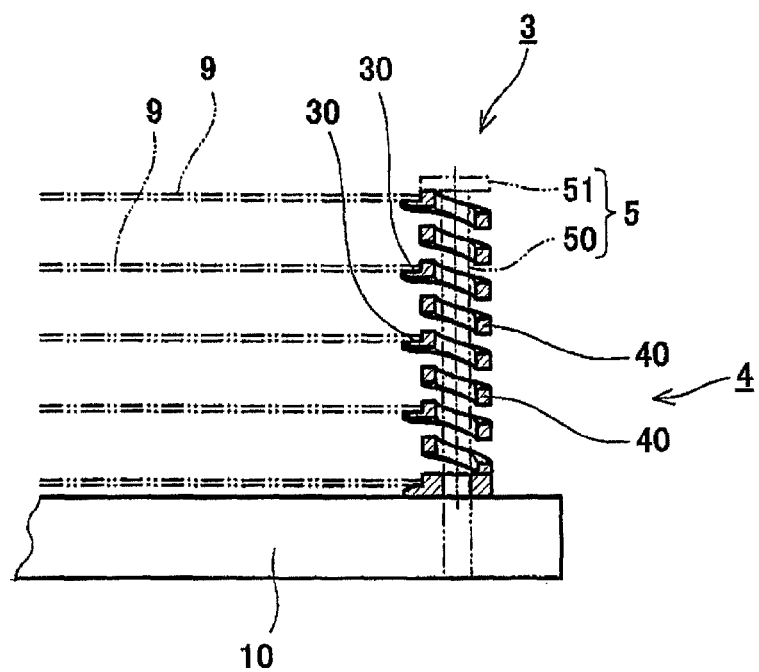
FIGS. 9A and 9B are partial cutaway views each showing the side surface of the pitch changing mechanism according to another embodiment.
Figure 9B:
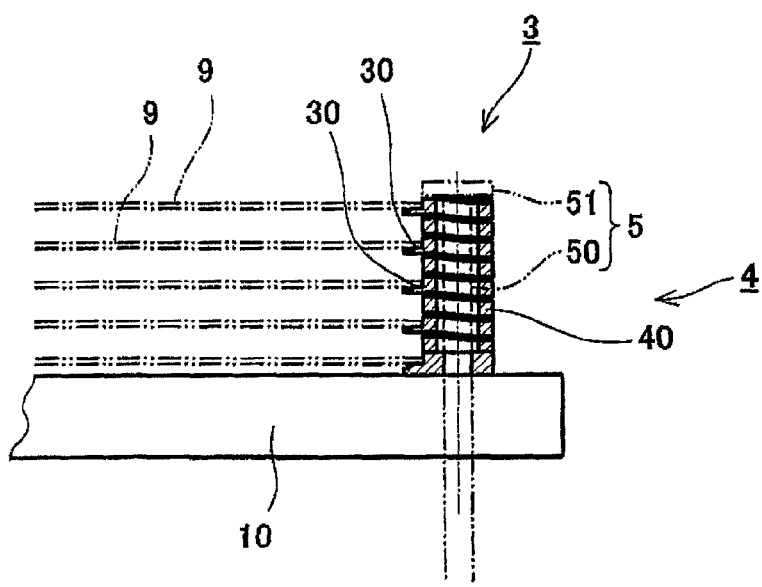

FIGS. 9A and 9B are partial cutaway views each showing the side surface of the pitch changing mechanism 4 according to Embodiment 2. FIG. 9A shows an initial state where the pitches are large, and FIG. 9B shows a state where the pitches are small. The pitch changing mechanism 4 of the present embodiment is configured such that: the spring pitch thereof is made shorter than, to be specific, is set to half the spring pitch of the coil spring 40 of the pitch changing mechanism 4 shown in FIG. 7A; and one nail piece 30 is arranged for each spring pitch. In this example, when the piston pin 50 moves down from the initial state shown in FIG. 9A, the coil spring 40 contracts, and the adjacent coils tightly contact each other. Thus, the intervals each between the adjacent nail pieces 30 are shortened, so that as shown in FIG. 9B, the intervals each between the semiconductor wafers 9 adjacent to each other in the upper-lower direction are also shortened. With this, the upper-lower intervals of the plurality of semiconductor wafers taken out from the foup are shortened, and the plurality of semiconductor wafers are transferred to the processing booth. Subsequent operations of the pitch changing mechanism 4 are the same as those of Embodiment 1, so that explanations thereof are omitted.

Embodiment 3 of Pitch Changing Mechanism

Figure 10A:
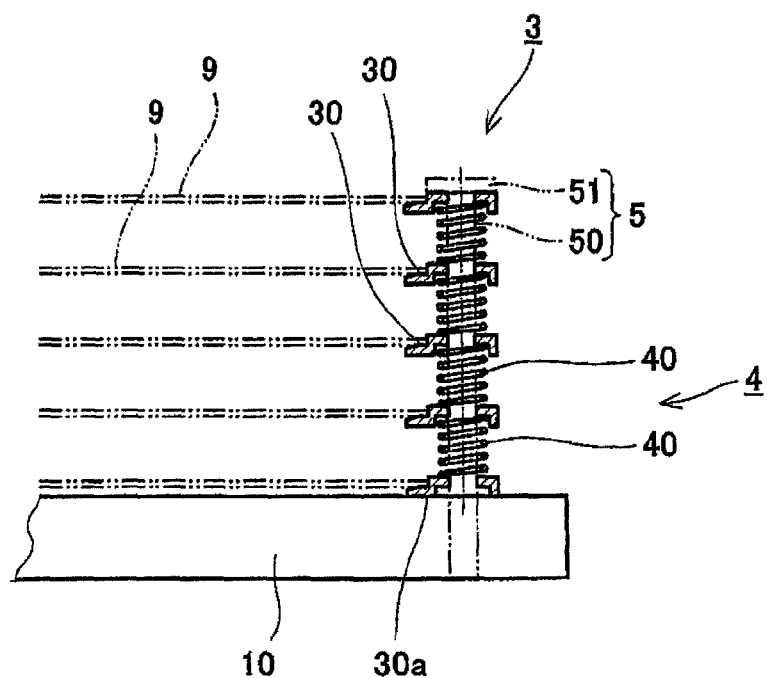
FIGS. 10A and 10B are partial cutaway views each showing the side surface of the pitch changing mechanism according to still another embodiment.
Figure 10B:
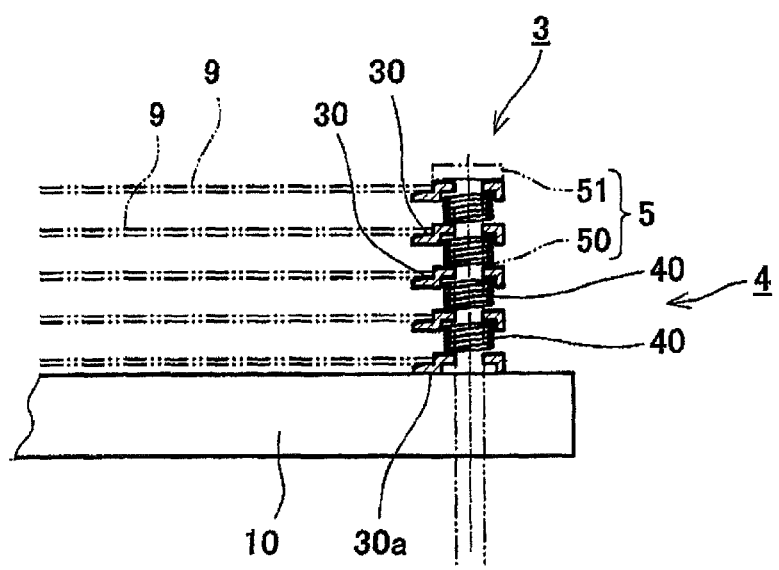

FIGS. 10A and 10B are partial cutaway views each showing the side surface of the pitch changing mechanism 4 according to Embodiment 3. FIG. 10A shows an initial state where the pitches are large, and FIG. 10B shows a state where the pitches are small. In the present embodiment, the piston pin 50 is a square shaft having a rectangular cross section, and a plurality of coil springs 40 are fitted on the piston pin 50 so as to be stacked at plural stages. The coil springs 40 herein are compression coil springs as with Embodiments 1 and 2, and each of the coil springs 40 herein is shorter than the coil spring 40 of each of Embodiments 1 and 2. The nail piece 30 is attached to the upper end portion of each of the coil springs 40, and the tip end portion of each nail piece 30 faces the center portion of the semiconductor wafer 9. A certain nail piece 30 and the coil spring 40 contacting the upper surface of the certain nail piece 30 are joined to each other, that is, the coil springs 40 adjacent to each other in the upper-lower direction are joined to each other via the nail piece 30. As with Embodiment 1, the nail pieces 30 adjacent to each other in the upper-lower direction are arranged so as to be spaced apart from each other in the upper-lower direction. Each nail piece 30 is fitted on the piston pin 50 to be moved up and down. In the initial state where the intervals each between the adjacent nail pieces 30 are large as shown in FIG. 10A, each of the coil springs 40 is in the free length state or is being slightly pushed downward. Five nail pieces 3 are provided. The nail piece 30a located at the lowest position is a fixed nail piece fixed to the blade 10, and the other four nail pieces 30 are movable nail pieces that move up and down.

When the piston pin 50 moves down from the initial state shown in FIG. 10A, the coil springs 40 are pressed downward by the flange 51 to contract against upward elastic biasing forces until the adjacent coils tightly contact each other. Since the distances each between the adjacent pitches of the coil spring 40 are shortened, the intervals each between the adjacent nail pieces 30 are also shortened. Thus, as shown in FIG. 10B, the intervals each between the semiconductor wafers 9 adjacent to each other in the upper-lower direction are also shortened. With this, the upper-lower intervals of the plurality of semiconductor wafers taken out from the foup are shortened, and the plurality of semiconductor wafers are transferred to the processing booth.

When the end effector device 1 including the pitch changing mechanism 4 has returned from the processing booth to the position opposed to the foup, the piston pin 50 moves up as shown in FIG. 10A. The coil springs 40 having been pressed downward expand upward by the elastic returning forces, so that the upper-lower intervals each between the adjacent nail pieces 30 increase.

The nail piece 30 and the coil spring 40 may be formed integrally but do not have to be formed integrally. Therefore, the nail piece 30 and the coil spring 40 may be made of different materials. For example, the nail piece 30 may be made of synthetic resin, and the coil spring 40 may be formed by a metal wire. As the coil spring 40, a general-purpose product formed by the metal wire is commercially available. Therefore, the pitch changing mechanism 4 can be manufactured at low cost by using the coil spring 40 that is the general-purpose product and is made of metal.

Figure 11:
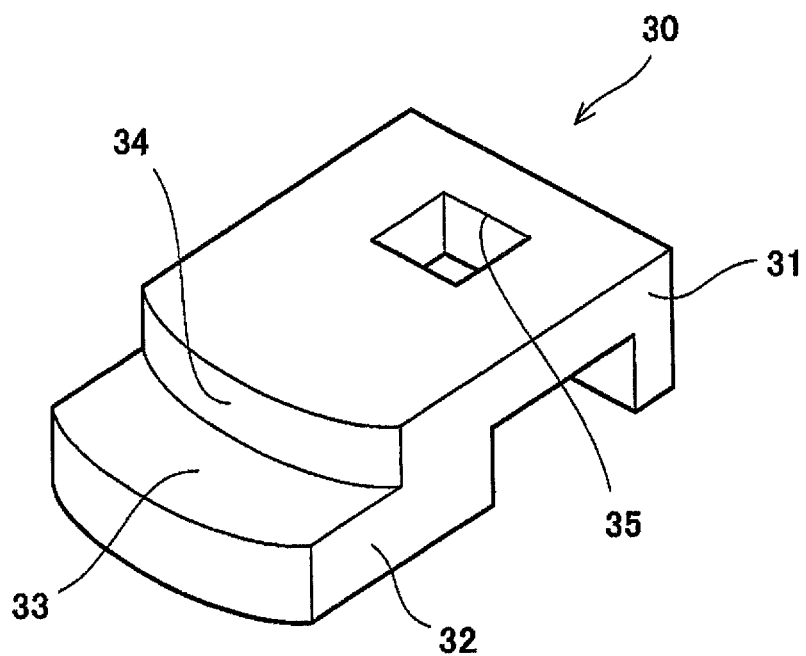
FIG. 11 is a perspective view of the nail piece used in the pitch changing mechanism of FIG. 10.

Since the piston pin 50 is a square shaft, the rotation of the nail piece 30 around the piston pin 50 can be prevented by the piston pin 50. FIG. 11 is a perspective view of the nail piece 30 used in the pitch changing mechanism 4 of Embodiment 3. A through hole 35 having a rectangular shape is formed on the main body 31 of the nail piece 30 so as to penetrate the main body 31 in the upper lower direction. The piston pin 50 is fitted in the through hole 35 such that the nail piece 30 is slidable. With this, the nail piece 30 is prevented from unexpectedly rotating around the piston pin 50, and the nail piece 30 surely supports the lower surface of the semiconductor wafer 9. In Embodiments 1 and 2, the piston pin 50 may be formed as a square shaft, and an inner opening of the coil spring 40 that is fitted on the piston pin 50 may be formed in a rectangular shape. That is, the piston pin 50 and the coil spring 40 may be formed in any shape as long as relative rotations thereof are prevented.

Embodiment 4 of Pitch Changing Mechanism

Figure 12A:
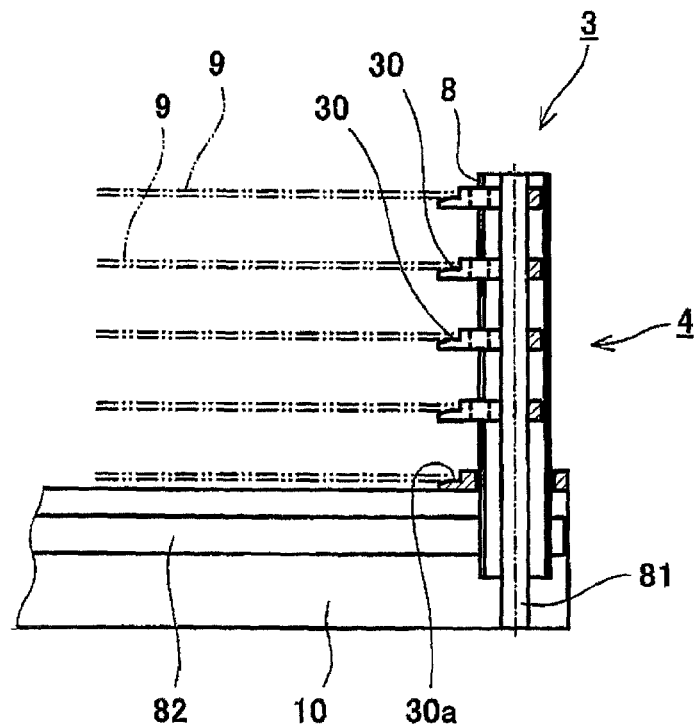
FIGS. 12A and 12B are partial cutaway views each showing the side surface of the pitch changing mechanism according to yet another embodiment.
Figure 12B:
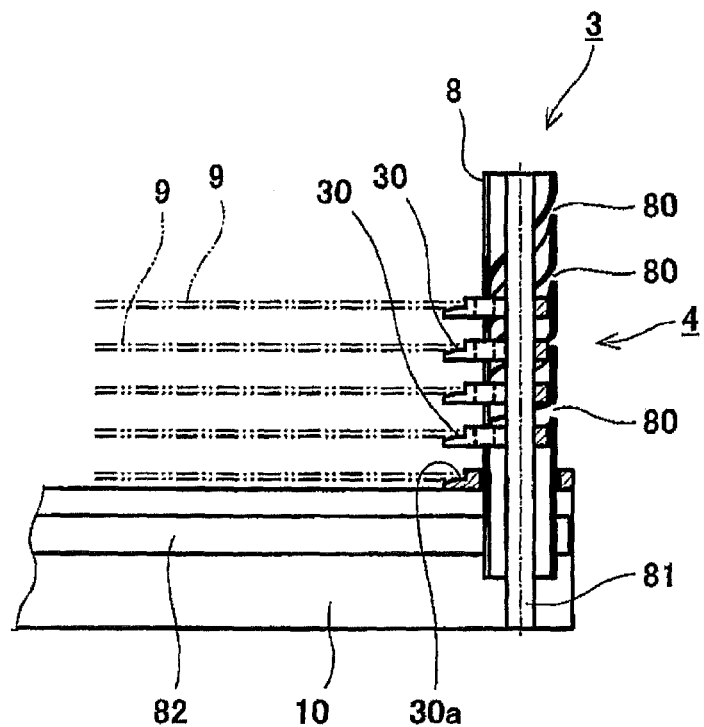
Figure 13:
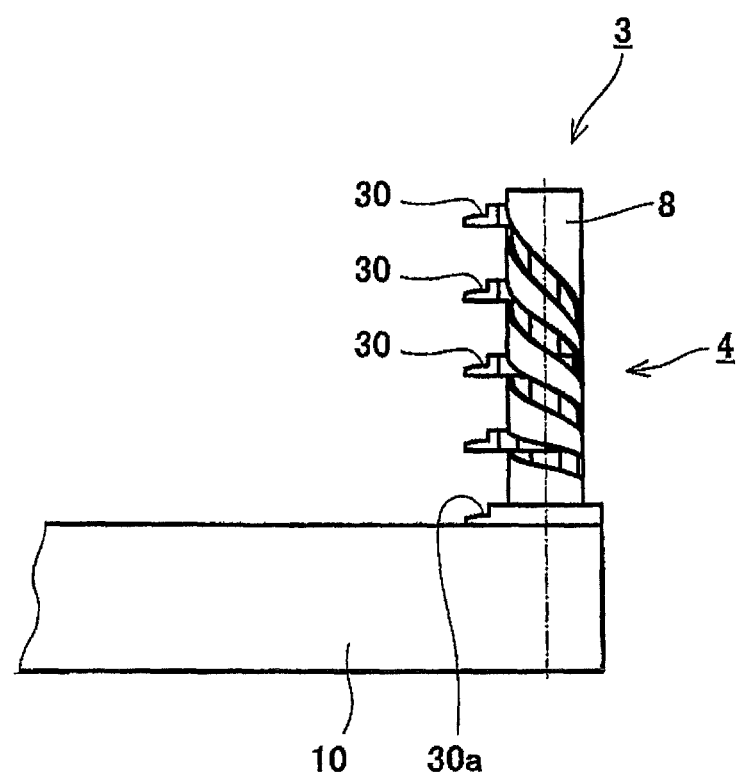
FIG. 13 is a side view of a cylindrical body used in the pitch changing mechanism of FIG. 12.

FIGS. 12A and 12B are partial cutaway views each showing the side surface of the pitch changing mechanism 4 according to Embodiment 4. FIG. 12A shows an initial state where the pitches are large, and FIG. 12B shows a state where the pitches are small. FIG. 13 is a side view of a cylindrical body 8 used in the pitch changing mechanism 4. In the present embodiment, the nail piece 30a located at the lowest position is a fixed nail piece fixed to the blade 10, and the other four nail pieces 30 are movable nail pieces.

The pitch changing mechanism 4 includes the cylindrical body 8 provided on the blade 10, and a nail piece guide shaft 81 is provided inside the cylindrical body 8 so as to extend in the upper-lower direction. The cylindrical body 8 is provided so as to be rotatable around the nail piece guide shaft 81 in the horizontal plane. A plurality of spiral grooves 80 are formed on a peripheral surface of the cylindrical body 8 so as to penetrate the outer and inner sides of the cylindrical body 8 and respectively correspond to the nail pieces 30. An upper-lower length of a portion of the spiral groove 80 is called a spiral pitch, the portion corresponding to one circumference of the outer peripheral surface of the cylindrical body 8. The spiral pitch of the spiral groove 80 located at a higher position is larger, and the spiral pitch of the spiral groove 80 located at a lower position is smaller. This is because, as described above, to equally shorten the intervals each between the adjacent nail pieces 30, the lowering distance of the nail piece 30 located at a higher position needs to be larger.

The base end portion of each nail piece 30 is fitted on the nail piece guide shaft 81, and the tip end portion thereof penetrates the spiral groove 80 to face the center portion of the semiconductor wafer 9. The nail piece guide shaft 81 is a square shaft, and as shown in FIG. 11, the through hole 35 having a rectangular shape is formed on the main body 31 of the nail piece 30 of the present embodiment. Therefore, even if the cylindrical body 8 rotates, the nail pieces 30 do not rotate and are just allowed to move up and down.

There are various mechanisms configured to cause the cylindrical body 8 to rotate. As shown in FIGS. 12A and 12B, one example is that: one end portion of a timing belt 82 is wound around the lower end portion of the cylindrical body 8; and the other end portion of the timing belt 82 is connected to a direct drive device (not shown), such as a motor or air cylinder provided at the second arm 21. Such a motor or air cylinder may be provided at the blade 10.

As shown in FIG. 12A, from the initial state where the nail pieces 30 adjacent to each other in the upper-lower direction are spaced apart from each other by a predetermined interval, the cylindrical body 8 is rotated in a clockwise direction when viewed from above. The nail pieces 30 move down along the spiral grooves 80. As described above, the spiral pitch of the spiral groove 80 located at a higher position is larger, and the spiral pitch of the spiral groove 80 located at a lower position is smaller. Therefore, the lowering distance of the nail piece 30 located at the highest position is the largest, and the lowering distance of the nail piece 30 located at a lower position becomes smaller. In a state where the downward movement of the nail piece 30 located at the highest position has been completed, as shown in FIG. 12B, the intervals each between the adjacent nail pieces 30 are respectively shorter than those in the initial state shown in FIG. 12A. With this, the upper-lower intervals of the plurality of semiconductor wafers taken out from the foup are shortened, and the plurality of semiconductor wafers are transferred to the processing booth.

After the plurality of semiconductor wafers 9 are taken out in the processing booth, the end effector device 1 including the pitch changing mechanism 4 returns to the initial state so as to be opposed to the foup. At this time, the cylindrical body 8 is rotated in a counterclockwise direction when viewed from above, and the nail pieces 30 are moved up from the state shown in FIG. 12B to the state shown in FIG. 12A. The pitch changing mechanism 4 returns to the initial state.

The present embodiment may be configured such that: the nail piece guide shaft is provided outside the cylindrical body 8; and the nail pieces 30 are fitted in the spiral grooves 80 of the cylindrical body 8 (see FIG. 13; the nail piece guide shaft is not shown in FIG. 13). In this case, the spiral groove 80 does not have to penetrate the outside and inside of the cylindrical body 8 and may be formed on the peripheral surface of the cylindrical body 8.

Embodiment 5 of Pitch Changing Mechanism

Figure 14A:
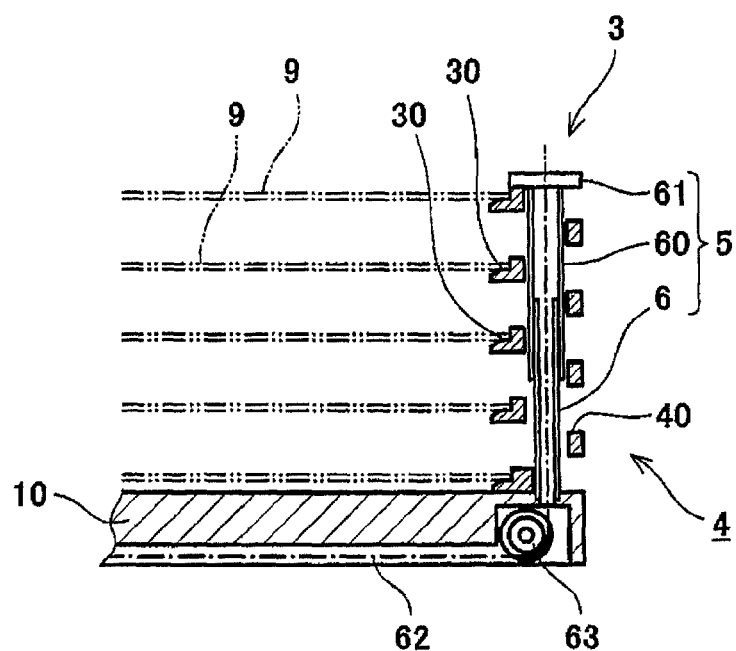
FIGS. 14A and 14B are partial cutaway views each showing the side surface of the pitch changing mechanism according to still another embodiment.
Figure 14B:
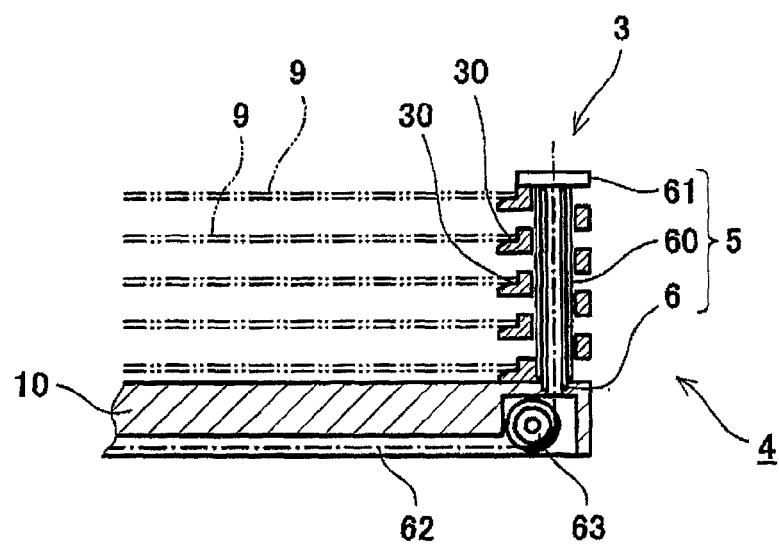

FIGS. 14A and 14B are partial cutaway views each showing the side surface of the pitch changing mechanism 4 according to Embodiment 5 and showing another example of the operating mechanism 5 configured to cause the nail pieces 30 to move up and down. FIG. 14A shows an initial state where the pitches are large, and FIG. 14B shows a state where the pitches are small.

The operating mechanism 5 includes: a hollow fixed shaft 6 standing on the blade 10; and an extendable shaft 60, whose lower surface is open and which is fitted on the fixed shaft 6 from an upper side of the fixed shaft 6 so as to be able to move up and down. As with Embodiment 1, the coil spring 40 including the plurality of nail pieces 30 respectively corresponding to the pitches are fitted outside the fixed shaft 6 and the extendable shaft 60. A flange 61 is provided at an upper end portion of the extendable shaft 60, and the nail piece 30 located at the highest position is attached to the flange 61. With this, when the extendable shaft 60 moves up or down, the coil spring 40 expands or contracts, so that the upper-lower intervals each between the adjacent nail pieces 30 change. The present embodiment may be configured such that: the nail piece 30 located at the highest position is not attached to the flange 61 and is pressed by the biasing force of the coil spring 40 to contact the flange 61.

The operating mechanism 5 includes a cylinder (not shown) located at the base end portion side of the second arm 21, and the cylinder and the flange 61 are connected to each other via a wire 62 extending through the fixed shaft 6 and the extendable shaft 60. The wire 62 extends downward from the lower surface of the flange 61. After that, in the blade 10, the wire 62 winds around a pulley 63 provided under the fixed shaft 6, and then extends horizontally to be connected to the cylinder. A rotational center axis of the pulley 63 is substantially perpendicular to the wire 62 extending between the pulley 63 and the cylinder.

When the cylinder horizontally pulls the wire 62 from the initial state shown in FIG. 14A, the pulling movement of the wire 62 is converted into a downward pulling movement by the pulley 63, so that the flange 61 is pulled downward. The coil spring 40 is pressed downward against the elastic biasing force to contract until the adjacent coils tightly contact each other. As a result, as shown in FIG. 14B, the intervals each between the adjacent nail pieces 30 become shorter than those in the initial state shown in FIG. 14A. With this, the upper-lower intervals of the plurality of semiconductor wafers taken out from the foup are shortened, and the plurality of semiconductor wafers are transferred to the processing booth.

After the plurality of semiconductor wafers 9 are taken out in the processing booth, the end effector device 1 including the pitch changing mechanism 4 returns to the position opposed to the foup. At this time, the cylinder cancels the pulling operation of the wire 62. The coil spring 40 moves up by the elastic returning force. Thus, the intervals each between the adjacent nail pieces 30 increase, and the pitch changing mechanism 4 returns to the initial state.

In the present embodiment, the cylinder that is a driving source of the operating mechanism 5 is provided outside the blade 10 and at the base end portion side of the second arm 21. To be specific, the cylinder is not provided in or on the blade 10. Therefore, the pitch changing mechanism 4 can be reduced in size so as to be suitable for the incorporation into the end effector device 1.

In the present embodiment, since the weight of the cylinder is not applied to the tip end portion of the second arm 21, the weight on the tip end portion of the second arm 21 can be reduced, and the tip end portion of the second arm 21 can operate smoothly.

Embodiment 6 of Pitch Changing Mechanism

Figure 15A:
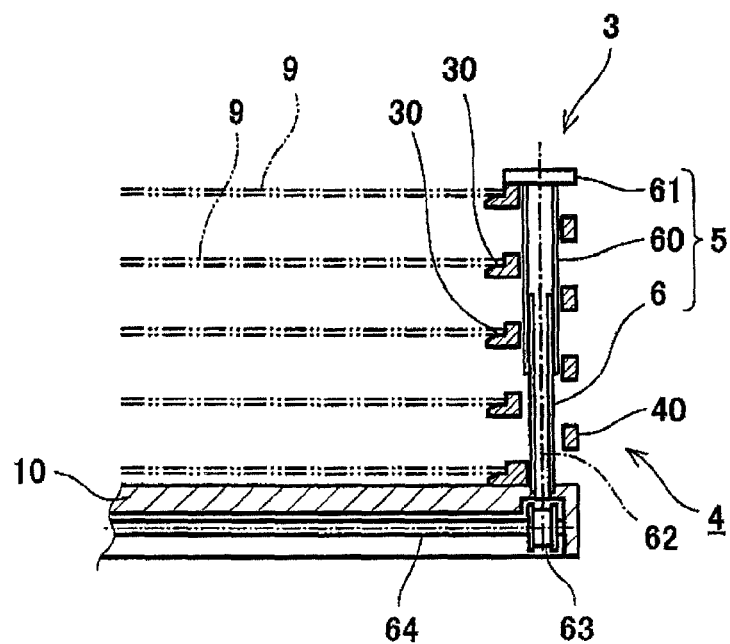
FIGS. 15A and 15B are partial cutaway views each showing the side surface of the pitch changing mechanism according to yet another embodiment.
Figure 15B:
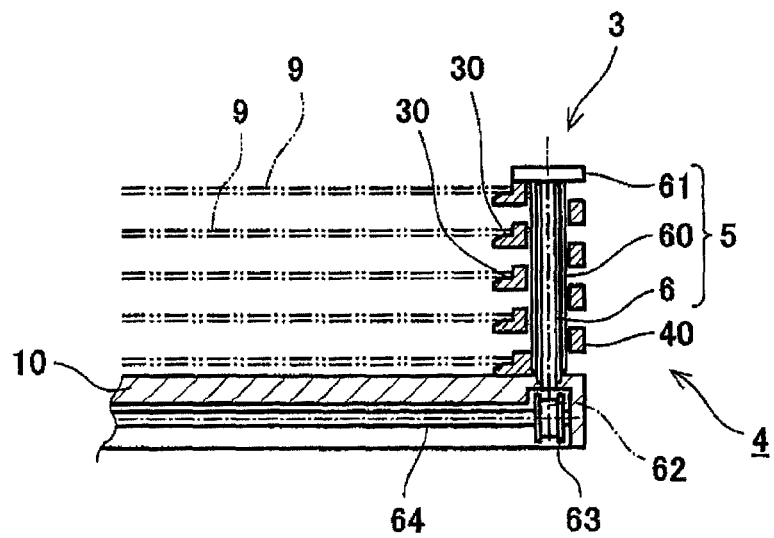

FIGS. 15A and 15B are partial cutaway views each showing the side surface of the pitch changing mechanism 4 according to Embodiment 6. FIG. 15A shows an initial state where the pitches are large, and FIG. 15B shows a state where the pitches are small. As with Embodiment 5, the operating mechanism 5 includes the fixed shaft 6 and the extendable shaft 60, the coil spring 40 including a plurality of nail pieces 30 respectively corresponding to the pitches is fitted outside the fixed shaft 6 and the extendable shaft 60, and the flange 61 of the extendable shaft 60 is pulled downward by the wire 62. However, in the present embodiment, a tip end portion of a rotary shaft 64 extending from a motor or rotary actuator (not shown) provided at the second arm 21 is connected to the pulley 63 provided in the blade 10 so as to be located under the fixed shaft 6, and the pulley 63 is directly rotated by the rotary shaft 64. The rotational center axis of the pulley 63 is substantially parallel to a longitudinal direction of the rotary shaft 64.

From the initial state shown in FIG. 15A, electric power is supplied to the motor or the rotary actuator. Thus, the rotary shaft 64 and the pulley 63 are rotated to pull the wire 62 downward. With this, the coil spring 40 is pressed downward by the flange 61 to contract against the elastic biasing force until the adjacent coils tightly contact each other. As a result, as shown in FIG. 15B, the intervals each between the adjacent nail pieces 30 become shorter than those in the initial state shown in FIG. 15A. With this, the upper-lower intervals of the plurality of semiconductor wafers taken out from the foup are shortened, and the plurality of semiconductor wafers are transferred to the processing booth. Subsequent operations are the same as those in Embodiment 5, so that explanations thereof are omitted.

Embodiment 7 of Pitch Changing Mechanism

Figure 16A:
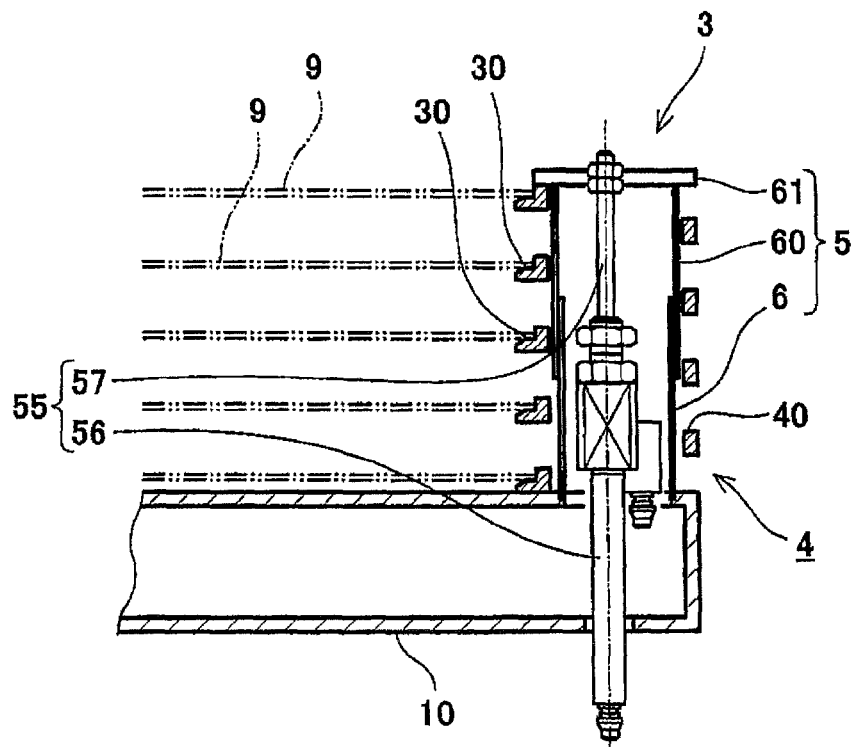
FIGS. 16A and 16B are partial cutaway views each showing the side surface of the pitch changing mechanism according to still another embodiment.
Figure 16B:
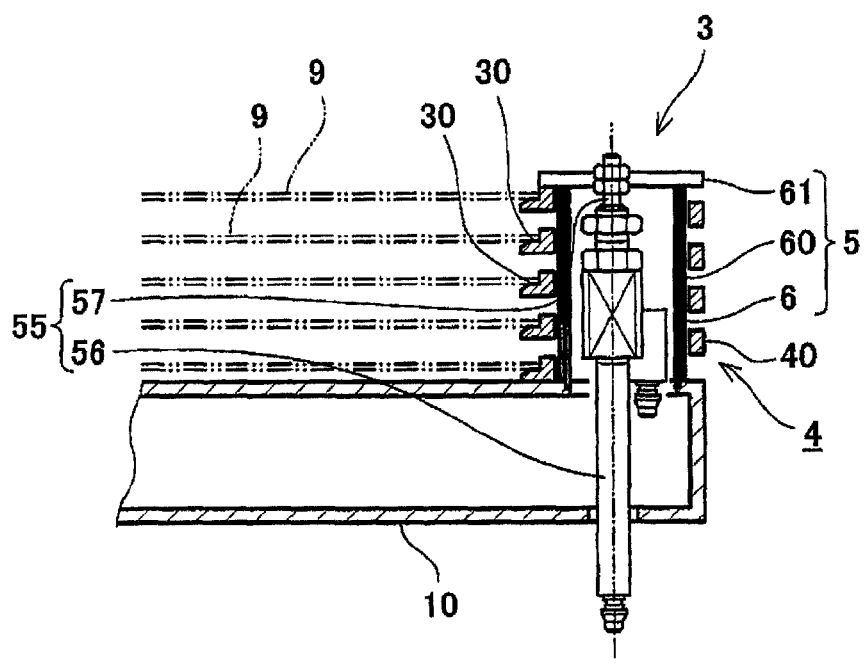

FIGS. 16A and 16B are partial cutaway views each showing the side surface of the pitch changing mechanism 4 according to Embodiment 7. FIG. 16A shows an initial state where the pitches are large, and FIG. 16B shows a state where the pitches are small. As with Embodiments 5 and 6, the operating mechanism 5 includes the fixed shaft 6 and the extendable shaft 60, the coil spring 40 including the plurality of nail pieces 30 respectively corresponding to the pitches is fitted outside the shafts 6 and 60, and the flange 61 of the extendable shaft 60 is pulled downward. However, in the present embodiment, the flange 61 is moved up and down not by the wire 62 but by an air cylinder 55 provided in the extendable shaft 60. The air cylinder 55 is a double acting type configured such that: a piston rod 57 is provided at a cylinder main body 56 having a cylindrical shape so as to be projectable; and the piston rod 57 reciprocates by introducing air to the cylinder main body 56 or by suctioning air from the cylinder main body 56. A tip end portion of the piston rod 57 is connected to the flange 61, so that the piston rod 57 causes the flange 61 to move up and down.

In the initial state shown in FIG. 16A, the piston rod 57 projects upward from the cylinder main body 56. By suctioning the air from the cylinder main body 56, as shown in FIG. 16B, the piston rod 57 moves down, so that the flange 61 moves down. The coil spring 40 is pressed downward against the elastic biasing force to contract until the adjacent coils tightly contact each other. As a result, the intervals each between the adjacent nail pieces 30 become shorter than those in the initial state. With this, the upper-lower intervals of the plurality of semiconductor wafers taken out from the foup are shortened, and the plurality of semiconductor wafers are transferred to the processing booth. Subsequent operations are the same as those in Embodiment 5, so that explanations thereof are omitted.

Embodiment 8 of Pitch Changing Mechanism

Figure 17A:
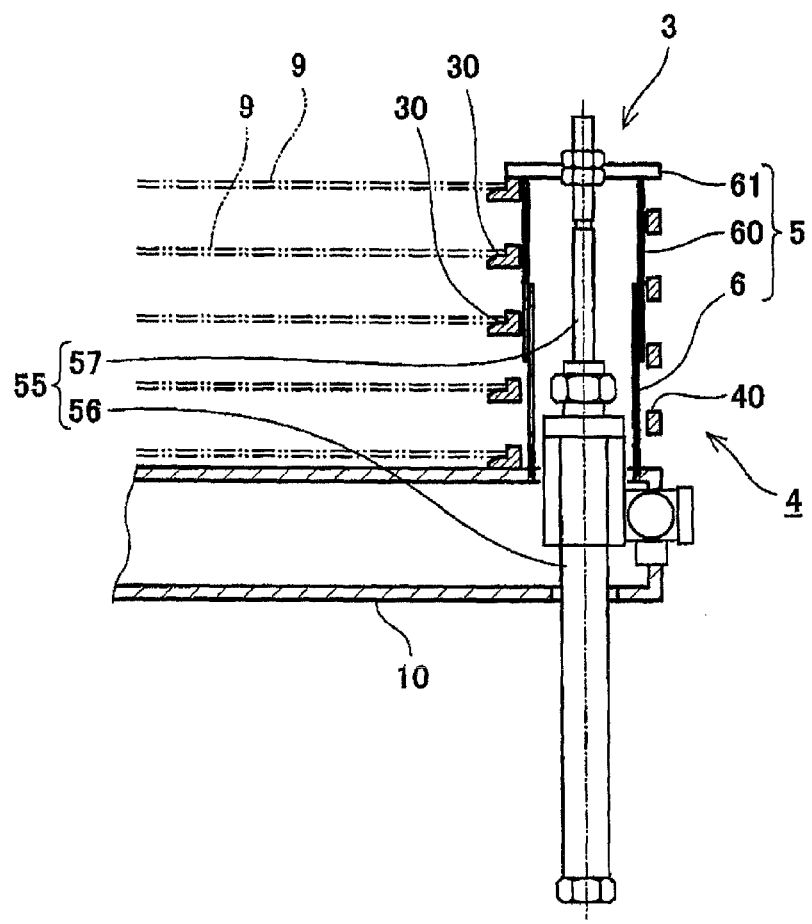
FIGS. 17A and 17B are partial cutaway views each showing the side surface of the pitch changing mechanism according to yet another embodiment.
Figure 17B:
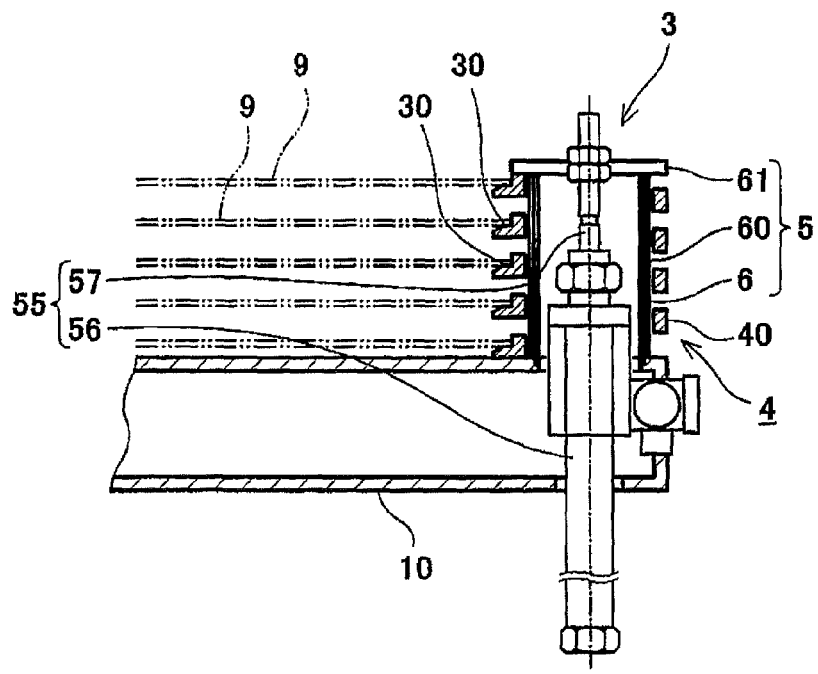

FIGS. 17A and 17B are partial cutaway views each showing the side surface of the pitch changing mechanism 4 according to Embodiment 8. FIG. 17A shows an initial state where the pitches are large, and FIG. 17B shows a state where the pitches are small. As with Embodiment 7, the operating mechanism 5 includes the fixed shaft 6 and the extendable shaft 60, the coil spring 40 including the plurality of nail pieces 30 respectively corresponding to the pitches are fitted outside the shafts 6 and 60, and the flange 61 of the extendable shaft 60 is pulled downward by the air cylinder 55. However, in the present embodiment, the air cylinder 55 is a single acting type configured such that the piston rod 57 is moved in only one direction by performing only one of air suction and air introduction. In this single acting type air cylinder 55, when the air suction or the air introduction is stopped, the piston rod 57 returns to a position where the piston rod 57 has been located before the air suction or the air introduction, by a spring incorporated in the cylinder main body 56. For convenience of explanation, the following will explain a case where the air cylinder 55 performs only the air suction.

In the initial state shown in FIG. 17A, the piston rod 57 projects upward from the cylinder main body 56. When the cylinder main body 56 suctions the air, as shown in FIG. 17B, the piston rod 57 moves down, so that the flange 61 moves down. The coil spring 40 is pressed downward against the elastic biasing force to contract until the adjacent coils tightly contact each other. As a result, the intervals each between the adjacent nail pieces 30 become shorter than those in the initial state. With this, the upper-lower intervals of the plurality of semiconductor wafers taken out from the foup are shortened, and the plurality of semiconductor wafers are transferred to the processing booth. When the cylinder main body 56 cancels the air suction, the piston rod 57 moves up by the spring incorporated in the cylinder main body 56 to return to the initial state.

Generally, the single acting type air cylinder 55 is simpler in configuration and lower in price than the double acting type air cylinder 55. Therefore, the pitch changing mechanism 4 that can be incorporated in the end effector device 1 can be configured to have a simple configuration and be low in price.

Embodiment 9 of Pitch Changing Mechanism

Figure 18:
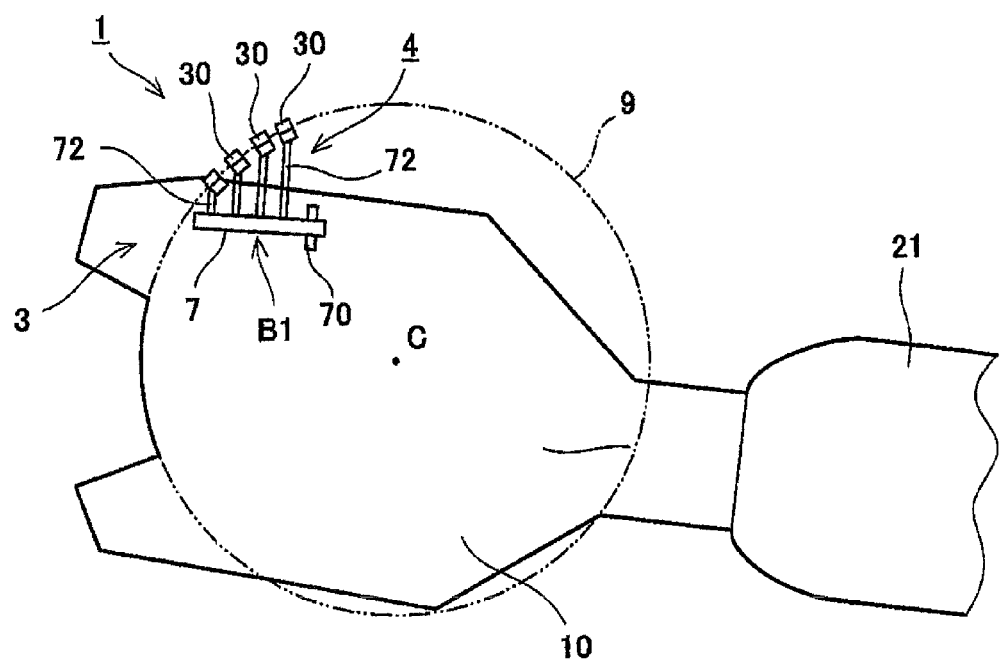
FIG. 18 is a plan view of the pitch changing mechanism according to still another embodiment.
Figure 19:
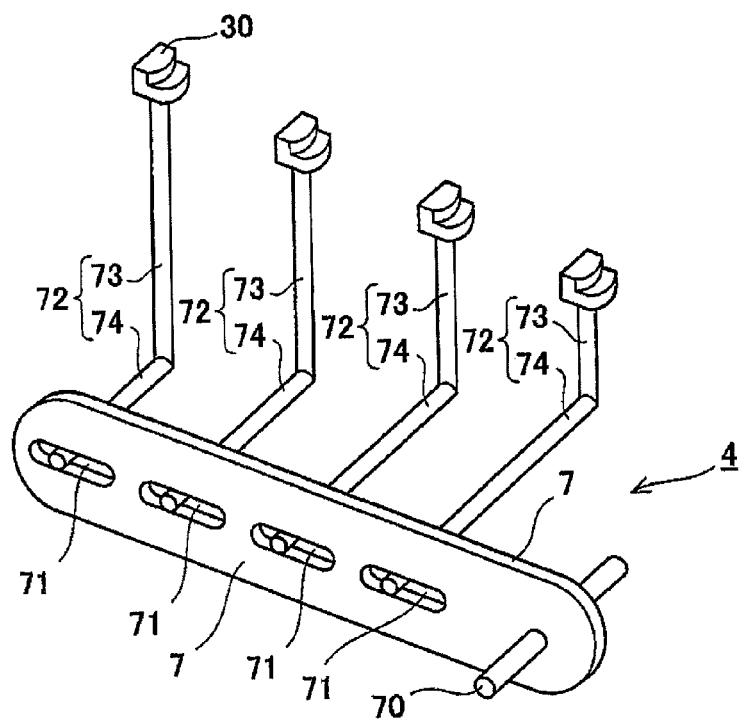
FIG. 19 is a perspective view showing major portions of the pitch changing mechanism shown in FIG. 18.
Figure 20A:
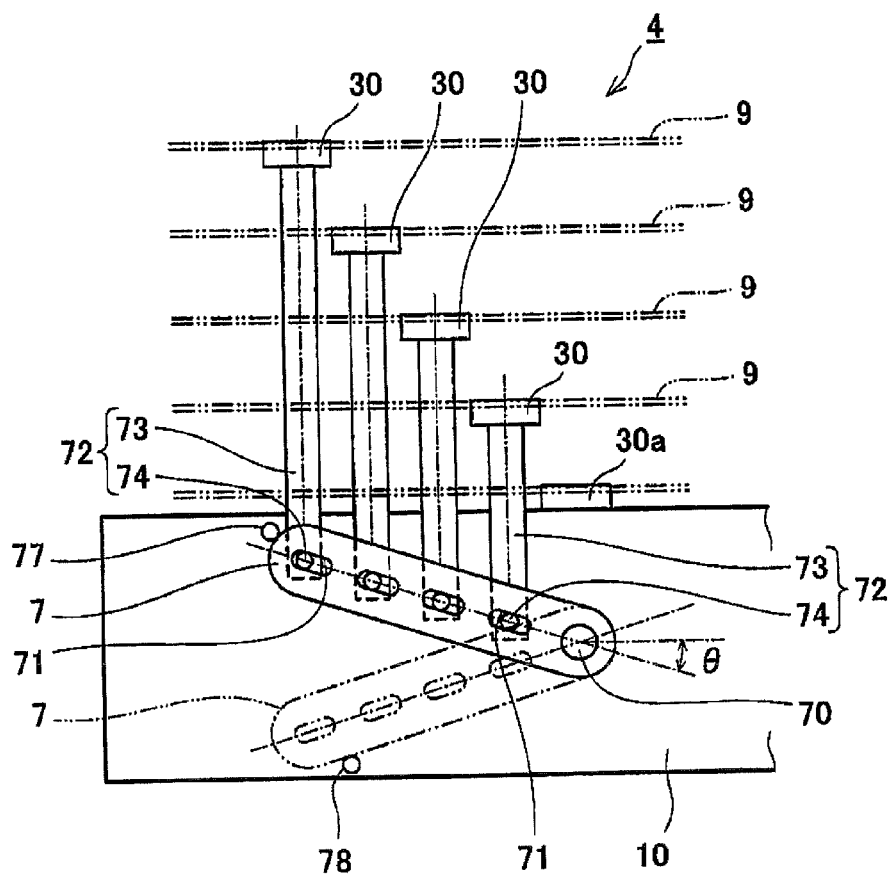
FIGS. 20A and 20B are side views each showing the pitch changing mechanism when viewed from a direction B1 of FIG. 18.
Figure 20B:
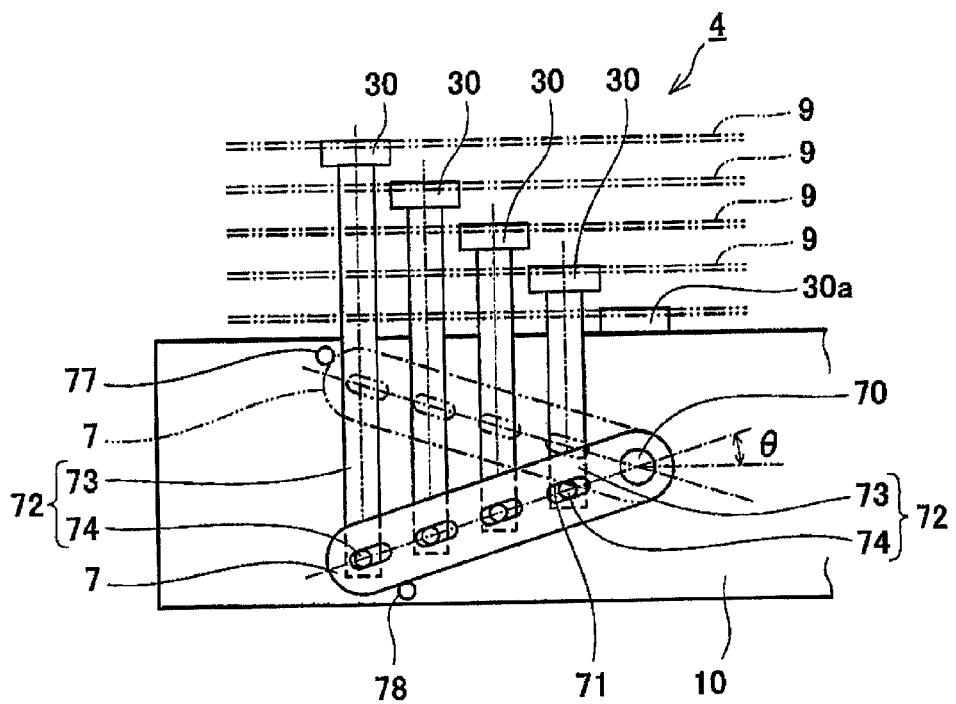

FIG. 18 is a plan view of the pitch changing mechanism 4 according to Embodiment 9. FIG. 19 is a perspective view showing major portions of the pitch changing mechanism 4. FIGS. 20A and 20B are side views each showing the pitch changing mechanism 4 when viewed from a direction B1 of FIG. 18. FIG. 20A shows an initial state where the pitches are large, and FIG. 20B shows a state where the pitches are small. In the present embodiment, the pitch changing mechanism 4 causes four nail pieces 30, located at different heights, to move up and down such that the nail pieces 30 support the peripheral portions of the corresponding semiconductor wafers 9. As with the above embodiments, a movement stroke of the nail piece 30 located at a higher position is larger.

The pitch changing mechanism 4 includes a long and thin swinging plate 7 provided inside the blade 10 and also inside an attachment position of the semiconductor wafer 9 and configured to swing around a central shaft 70 in a vertical plane, and the swinging plate 7 causes the nail pieces 30 to move up and down. There are various components for causing the swinging plate 7 to swing. One example is that a small motor is coupled to the central shaft 70. A plurality of elongated holes 71, the number of which corresponds to the number of nail pieces 30, are formed on the swinging plate 7 so as to extend along a longitudinal direction of the swinging plate 7. The nail pieces 30 are respectively attached to support shafts 72 each having a substantially L shape, and each of the support shafts 72 integrally includes: a vertical shaft 73 extending in a vertical direction and having an upper end portion to which the nail piece 30 is attached; and a horizontal shaft 74 extending in a horizontal direction from a lower end portion of the vertical shaft 73. A tip end portion of the horizontal shaft 74 is fitted in the corresponding elongated hole 71. When the nail piece 30 supported by the vertical shaft 73 of the support shaft 72 is lower in height, the horizontal shaft 74 of the support shaft 72 is fitted in the elongated hole 71 located closer to the central shaft 70 of the swinging plate 7. With this, up/down strokes of the nail piece 30 located at a higher position become larger.

In order that the vertical shafts 73 linearly move up and down, the vertical shafts 73 are respectively fitted in thrust bearings (not shown) provided on the blade 10.

In the initial state shown in FIG. 20A, the swinging plate 7 is inclined such that a tip end portion thereof is located at an upper side as shown by a solid line and contacts an upper stopper 77 located in the blade 10. An inclination angle of the swinging plate 7 relative to the horizontal plane at this time is θ. In the initial state, the nail pieces 30 lined up in the upper lower direction are located substantially at regular intervals.

When the swinging plate 7 swings downward around the central shaft 70 from the initial state, the support shafts 72 move down at once. Since a lowering stroke of the nail piece 30 located at a higher position is larger than that of the nail piece 30 located at a lower position, the intervals each between the nail pieces 30 adjacent to each other in the upper-lower direction become short, and as shown in FIG.

20B, the intervals each between the semiconductor wafers 9 adjacent to each other in the upper-lower direction also becomes short.

When the swinging plate 7 is inclined such that the tip end portion thereof is located at a lower side, and the angle of the swinging plate 7 relative to the horizontal plane is θ, that is, when the swinging plate 7 is rotated downward by an angle 20 from the initial state, the swinging plate 7 contacts a lower stopper 78 located in the blade 10 to stop. The nail pieces 30 lined up in the upper-lower direction are located substantially at regular intervals, and the intervals are shorter than those in the initial state.

With this, the upper-lower intervals of the plurality of semiconductor wafers taken out from the foup are shortened, and the plurality of semiconductor wafers are transferred to the processing booth.

After the plurality of semiconductor wafers are taken out in the processing booth, the end effector device 1 including the pitch changing mechanism 4 returns to the position opposed to the foup. At this time, the swinging plate 7 is rotated upward by the angle 20 around the central shaft 70. Thus, the nail pieces 30 return to the initial state.

Embodiment 10 of Pitch Changing Mechanism

Figure 21A:
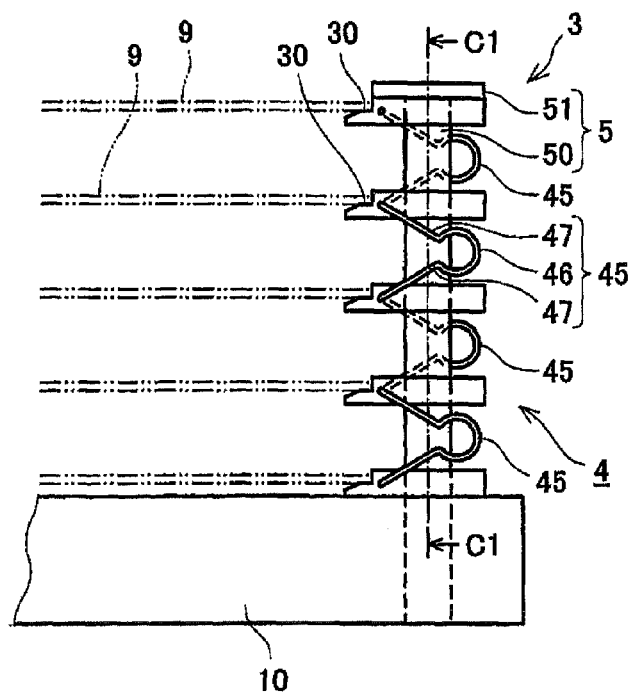
FIGS. 21A and 21B are side views each showing the pitch changing mechanism according to yet another embodiment.
Figure 21C:
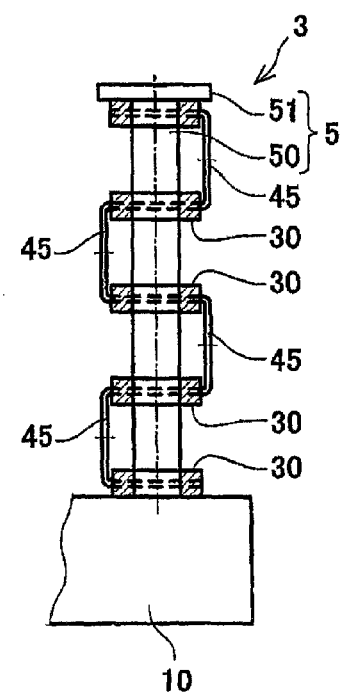
FIG. 21C is a cross-sectional view taken along line C1-C1 of FIG. 21A, which is viewed from a back surface of the pitch changing mechanism.
Figure 21B:
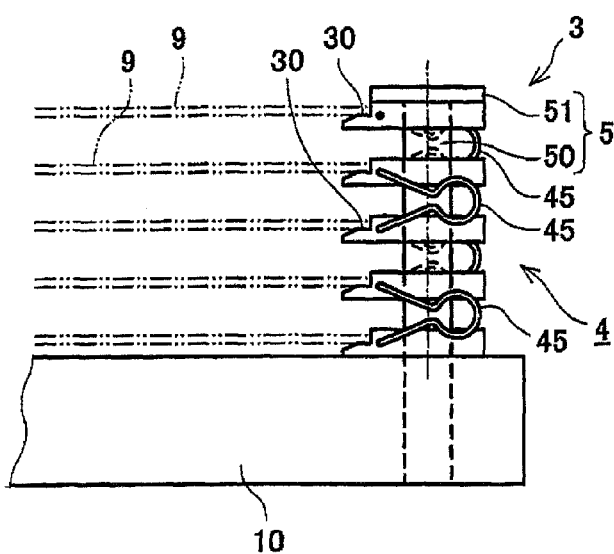

FIGS. 21A and 21B are partial cutaway views each showing the side surface of the pitch changing mechanism 4 according to Embodiment 10. FIG. 21A shows an initial state where the pitches are large, and FIG. 21B shows a state where the pitches are small. FIG. 21C is a cross-sectional view taken along line C1-C1 of FIG. 21A, which is viewed from a back surface of the pitch changing mechanism.

In the present embodiment, a plurality of nail pieces 30 are fitted on the piston pin 50 that is a square shaft having an upper end portion at which the flange 51 is provided. A mechanism of causing the piston pin 50 to move up and down is the same as that in Embodiment 3. The nail pieces 30 adjacent to each other in the upper-lower direction are connected to each other by a clip 45 that is an elastic member. The clip 45 is configured such that leg pieces 47 respectively project from upper and lower ends of a circular-arc supporting piece 46 so as to spread outward. When the clip 45 is pressed such that an angle between the leg pieces 47 is reduced, the clip 45 generates an elastic force in a direction opposite to a direction in which the clip 45 is pressed. As shown in FIG. 21C, the clips 45 are located at width direction end portions of the nail pieces 30, and the clips 45 adjacent to each other in the upper-lower direction are respectively provided at one end portion and the other end portion of the nail piece 30. With this, the elastic forces of the clips 45 are equally applied to both width direction end portions of each of the nail pieces 30.

When the piston pin 50 moves down from the initial state shown in FIG. 21A, the flange 51 pushes the leg pieces 47 of the clips 45 such that the angles each between the leg pieces 47 decrease. Thus, the clips 45 contract against the elastic biasing forces. Since the distances each between the adjacent pitches are shortened, the intervals each between the adjacent nail pieces 30 are also shortened. As described above, since the nail pieces 30 receive the lower surfaces of the peripheral portions of the semiconductor wafers 9, the intervals each between the semiconductor wafers 9 adjacent to each other in the upper-lower direction are also shortened. With this, the upper-lower intervals of the plurality of wafers 9 taken out from the foup are shortened, and the plurality of wafers 9 are transferred to the processing booth.

After the plurality of semiconductor wafers are taken out in the processing booth, the end effector device 1 including the pitch changing mechanism 4 returns to the position opposed to the foup. At this time, the piston pin 50 is moved up from the state shown in FIG. 21B to the state shown in FIG. 21A. The clips 45 elastically return such that the angles each between the leg pieces 47 increase, and the pitch changing mechanism 4 returns to the initial state. To be specific, even if the piston pin 50 does not pull up the clips 45, the pitch changing mechanism 4 returns to the initial state.

Embodiment 11 of Pitch Changing Mechanism

Figure 22A:
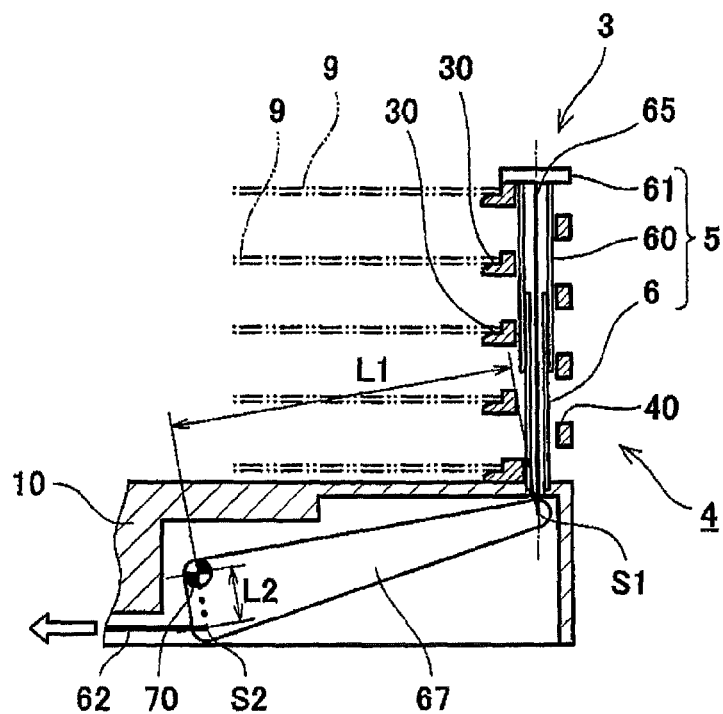
FIGS. 22A and 22B are partial cutaway views each showing the side surface of the pitch changing mechanism according to still another embodiment.
Figure 22B:
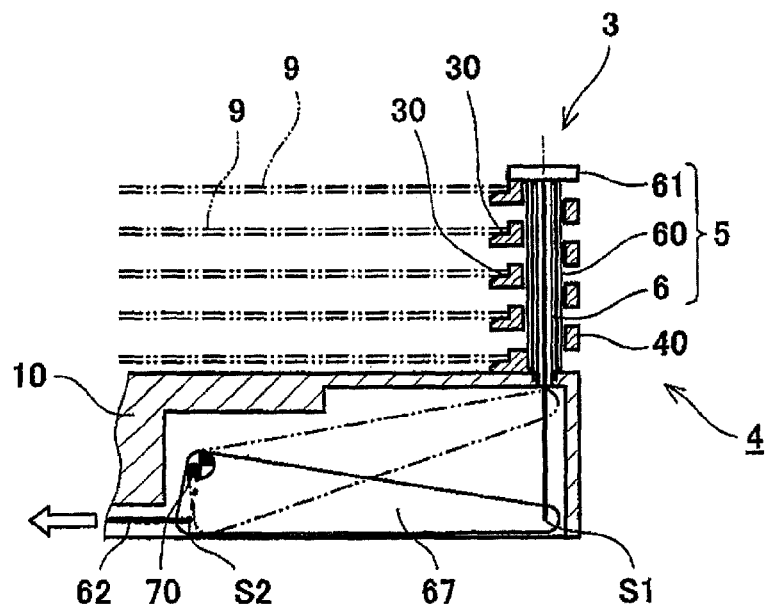

FIGS. 22A and 22B are partial cutaway views each showing the side surface of the pitch changing mechanism 4 according to Embodiment 11. FIG. 22A shows an initial state where the pitches are large, and FIG. 22B shows a state where the pitches are small. As with Embodiment 5, the operating mechanism 5 includes the fixed shaft 6 and the extendable shaft 60 having the upper end portion at which the flange 61 is provided, and the coil spring 40 including the plurality of nail pieces 30 respectively corresponding to the pitches is fitted outside the fixed shaft 6 and the extendable shaft 60. In the present embodiment, a substantially triangle swinging member 67 configured to swing in the vertical surface around the central shaft 70 provided in the blade 10 is provided. One end portion of the swinging member 67 and the flange 61 of the extendable shaft 60 are connected to each other via a vertical wire 65. A cylinder or motor (not shown) provided at the second arm 21 and the other end portion of the swinging member 67 are connected to each other via a horizontal wire 62 or a rod.

When the horizontal wire 62 or the rod is pulled by the cylinder or the motor from the initial state shown in FIG. 22A, the swinging member 67 rotates around the central shaft 70 in the clockwise direction. Therefore, the vertical wire 65 is pulled downward, so that the flange 61 moves down. Then, the coil spring 40 is pressed downward against the elastic biasing force to contract until the adjacent coils tightly contact each other. As a result, as shown in FIG. 22B, the intervals each between the adjacent nail pieces 30 become shorter than those in the initial state shown in FIG. 22A. With this, the upper-lower intervals of the plurality of semiconductor wafers taken out from the foup are shortened, and the plurality of semiconductor wafers are transferred to the processing booth.

When the pulling of the horizontal wire 62 or the rod is canceled, the coil spring 40 elastically returns, and the flange 61 moves up. Then, the intervals each between the adjacent nail pieces 30 increase, and the pitch changing mechanism 4 returns to the initial state.

In FIGS. 22A and 22B, a point of connection between one end portion of the swinging member 67 and the vertical wire 65 is shown as S1, and a point of connection between the other end portion of the swinging member 67 and the horizontal wire 62 or rod is shown as S2. A distance L1 from the central shaft 70 to the connection point S1 is longer than a distance L2 from the central shaft 70 to the connection point S2. With this, even in a case where a movement distance of the horizontal wire 62 pulled by the cylinder or motor is short, a movement distance of the flange 61 moved down by the vertical wire 65 can be made long. To be specific, even if the cylinder or motor of the second arm 21 is small in size, the coil spring 40 can be caused to contract significantly.

The swinging member 67 may have an L shape. To be specific, the positional relation among the central shaft 70, the connection point S1, and the connection point S2 may be maintained as in the above explanations.

Embodiment 12 of Pitch Changing Mechanism

Figure 23A:
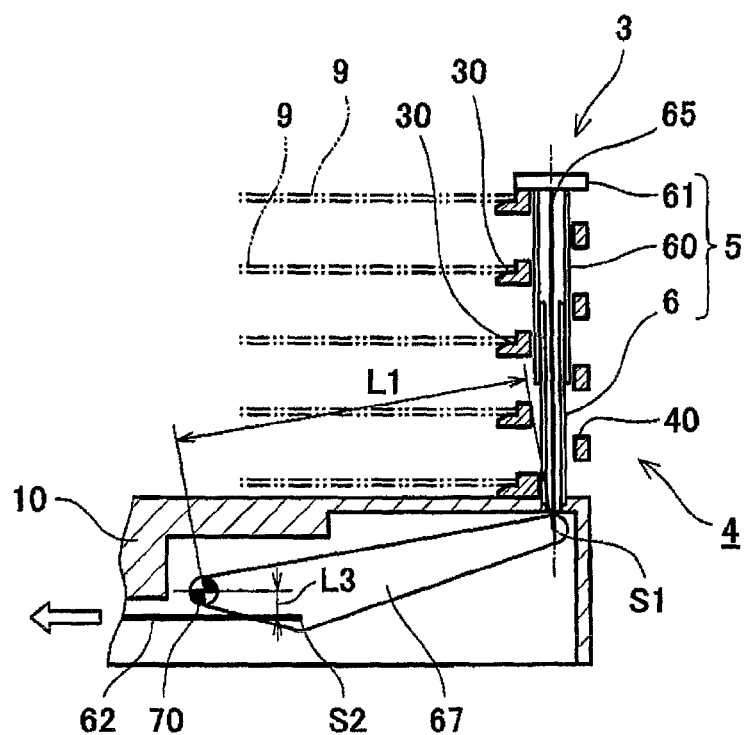
FIGS. 23A and 23B are partial cutaway views each showing the side surface of the pitch changing mechanism according to yet another embodiment.
Figure 23B:
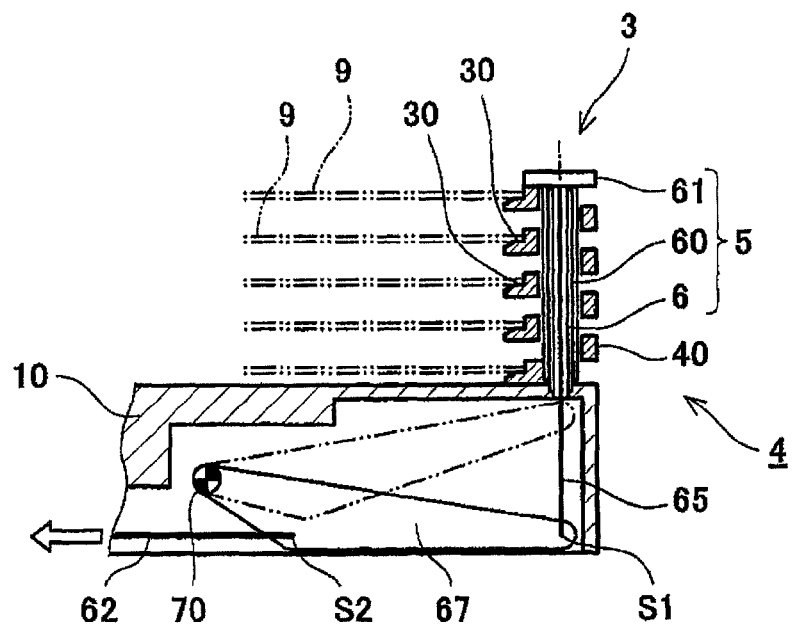

FIGS. 23A and 23B are partial cutaway views each showing the side surface of the pitch changing mechanism 4 according to Embodiment 12. FIG. 23A shows an initial state where the pitches are large, and FIG. 23B shows a state where the pitches are small.

The present embodiment is basically the same in configuration as Embodiment 11. However, a vertical distance L3 from the central shaft 70 to the connection point S2 is shorter than that in Embodiment 11. With this, even if the blade 10 is thin, the coil spring 40 at which the nail pieces 30 are provided can be caused to contract by using the swinging member 67.

Embodiment 13 of Pitch Changing Mechanism

Figure 24:
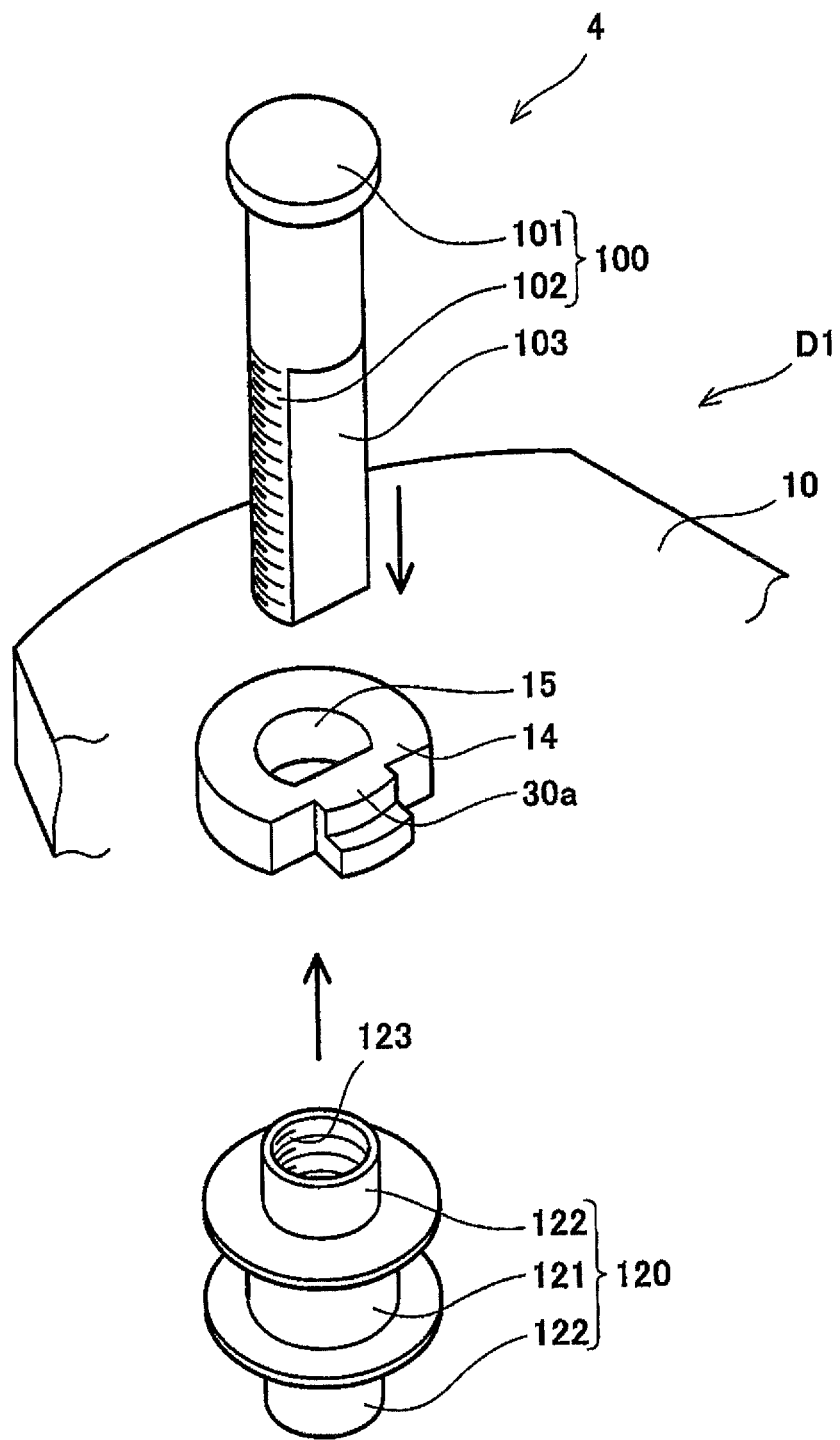
FIG. 24 is an exploded perspective view of the pitch changing mechanism according to still another embodiment.
Figure 25A:
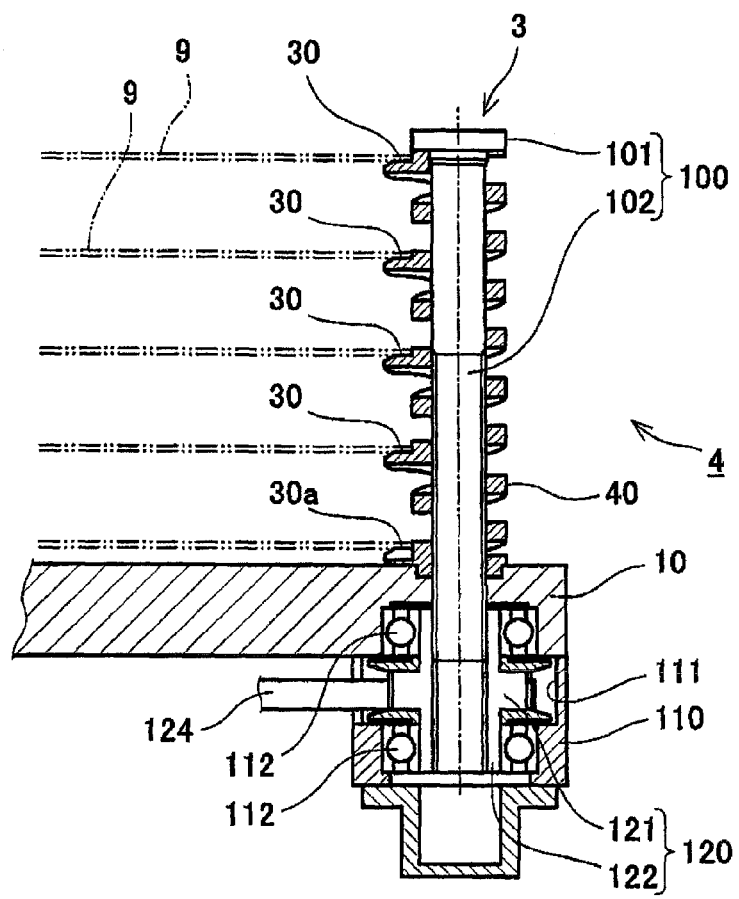
FIGS. 25A and 25B are cross-sectional views each showing the pitch changing mechanism when viewed from a direction D1 of FIG. 24.
Figure 25B:
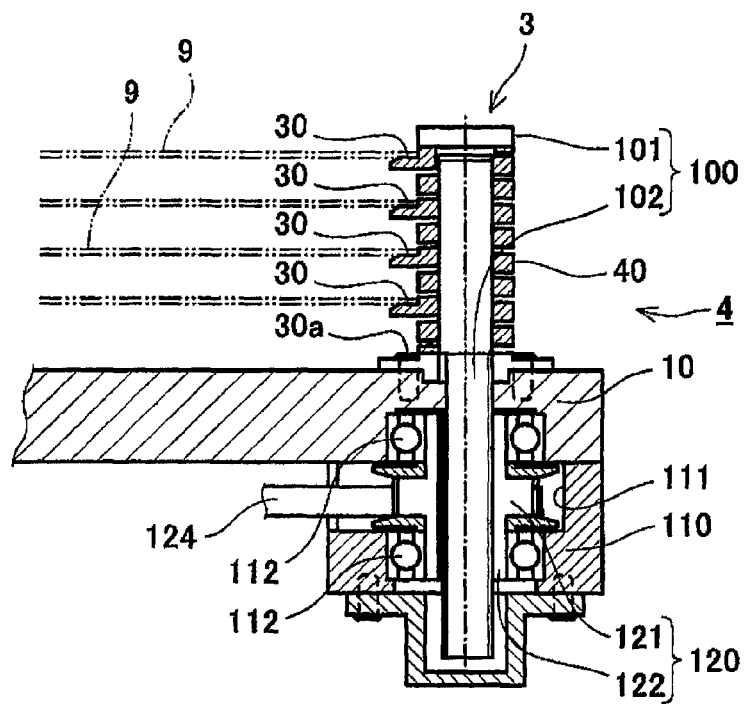

FIG. 24 is an exploded perspective view of the pitch changing mechanism 4 according to Embodiment 13, and for convenience sake, the coil spring 40 is not shown. FIGS. 25A and 25B are cross-sectional views each showing the pitch changing mechanism 4 when viewed from a direction D1 of FIG. 24. FIG. 25A shows an initial state where the pitches are large, and FIG. 25B shows a state where the pitches are small.

In the present embodiment, as with Embodiment 1, a plurality of nail pieces 30 are attached to the outer peripheral surface of the coil spring 40 at regular intervals in the upper-lower direction, and the nail piece 30a located at the lowest position is a fixed nail piece. The coil spring 40 is fitted on an up-and-down shaft 100 vertically provided at the blade 10. The up-and-down shaft 100 includes a flange body 101 located at an upper end portion thereof. A threaded shaft 102 is formed so as to extend downward from a longitudinal direction middle portion of the up-and-down shaft 100. The length of the threaded shaft 102 is determined in accordance with the up-down amount of the highest nail piece 30, that is, the longest up-down stroke. A vertically long cutout portion 103 is formed at a part of a peripheral surface of the threaded shaft 102, so that the threaded shaft 102 has a substantially D-shaped cross section. The nail piece 30a located at the lowest position is formed integrally with a receiving ring 14 fixed to the blade 10. A prevention hole 15 corresponding to the D-shaped cross section of the threaded shaft 102 is formed at the receiving ring 14. When the threaded shaft 102 is fitted in the prevention hole 15, the rotation of the threaded shaft 102 around a longitudinal direction axis is prevented, and only the up-and-down movements of the threaded shaft 102 are allowed.

As shown in FIGS. 25A and 25B, a bracket 110 having an upper surface on which a concave 111 is formed is attached to a position on the lower surface of the blade 10, the position corresponding to the up-and-down shaft 100. Bearings 112 are respectively attached to a lower surface of the concave 111 of the bracket 110 and the lower surface of the blade 10. A pulley assembly 120 (see FIG. 24) is provided between the lower surface of the blade 10 and the bracket 110. The pulley assembly 120 is configured such that receiving tubes 122 respectively project from upper and lower surfaces of a driven pulley 121. The driven pulley 121 is hollow, and a threaded surface 123 with which the threaded shaft 102 is threadedly engaged is formed on each of inner surfaces of the receiving tubes 122. The receiving tubes 122 are respectively, rotatably fitted in the bearings 112.

A motor (not shown) for causing the driven pulley 121 to rotate is provided at the second arm 21 (see FIG. 1), and an endless belt 124 extends between the motor and the driven pulley 121. When the motor rotates, the driven pulley 121 rotates, so that the receiving tubes 122 rotate. The receiving tubes 122 apply a rotational force to the threaded shaft 102. However, as described above, the threaded shaft 102 is fitted in the prevention hole 15, so that the rotation thereof is prevented. Therefore, only the up-and-down movements of the threaded shaft 102 by the rotation of the driven pulley 121 are allowed.

From the initial state shown in FIG. 25A, electric power is supplied to the motor, so that the driven pulley 121 is rotated. The threaded shaft 102 moves down, and this causes the flange body 101 to also move down. Thus, the coil spring 40 is pressed downward against the elastic biasing force. As a result, as shown in FIG. 25B, the adjacent coils of the coil spring 40 tightly contact each other, and the intervals each between the adjacent nail pieces 30 become shorter than those in the initial state shown in FIG. 25A. With this, the upper-lower intervals of the plurality of semiconductor wafers taken out from the foup are shortened, and the plurality of semiconductor wafers are transferred to the processing booth.

After a plurality of semiconductor wafers are taken out in the processing booth, the end effector device 1 including the pitch changing mechanism 4 returns to the position opposed to the foup. At this time, the motor is reversely rotated, and the coil spring 40 configured to cause the threaded shaft 102 to move up expands upward by the elastic returning force. Thus, the upper-lower intervals each between the adjacent nail pieces 30 increase, and the pitch changing mechanism 4 returns to the initial state.

In FIGS. 25A and 25B, the coil spring 40 is formed clockwise when viewed from above. Typically, the threaded shaft 102 on which the coil spring 40 is fitted is formed clockwise when viewed from above. Therefore, there is a possibility that when causing the coil spring 40 to expand or contract, the inside of the coil spring 40 is caught on the threaded shaft 102. On this account, it is preferable that the coil spring 40 be formed counterclockwise.

According to the end effector device 1 of the above embodiments, the intervals each between the adjacent nail pieces 30 are shortened while the end effector device 1 in the initial state is conveyed to the processing booth.

However, instead of this, the intervals each between the adjacent nail pieces 30 may be increased while the end effector device 1 in the initial state is conveyed to the processing booth.

The foregoing has explained a case where there are two types of pitches. However, an arbitrary pitch between a maximum pitch and a minimum pitch may be realized.

The above explanation is made on the basis that the semiconductor wafer 9 is substantially horizontally supported by three nail pieces 30. However, the semiconductor wafer 9 does not have to be in a substantially horizontal state.

The blade 10 does not have to have a plate shape shown in FIG. 1. For example, the blade 10 may have a structure, such as a frame structure in which frames are combined. That is, the blade 10 may have any structure as long as it can hold the support units and support a plurality of semiconductor wafers.

In the present application, the term "hold" means a state where the semiconductor wafer can be conveyed by the end effector device and includes states in addition to the edge grip. For example, only the lower surface of the semiconductor wafer 9 may be supported. In this case, the positional displacement between the semiconductor wafer 9 and the nail piece 30 is limited by the frictional force.

The coil spring 40 of pitch changing mechanism 4 does not have to be contracted until the adjacent coils thereof tightly contact each other.

Embodiment 2 of End Effector Device

Figure 26:
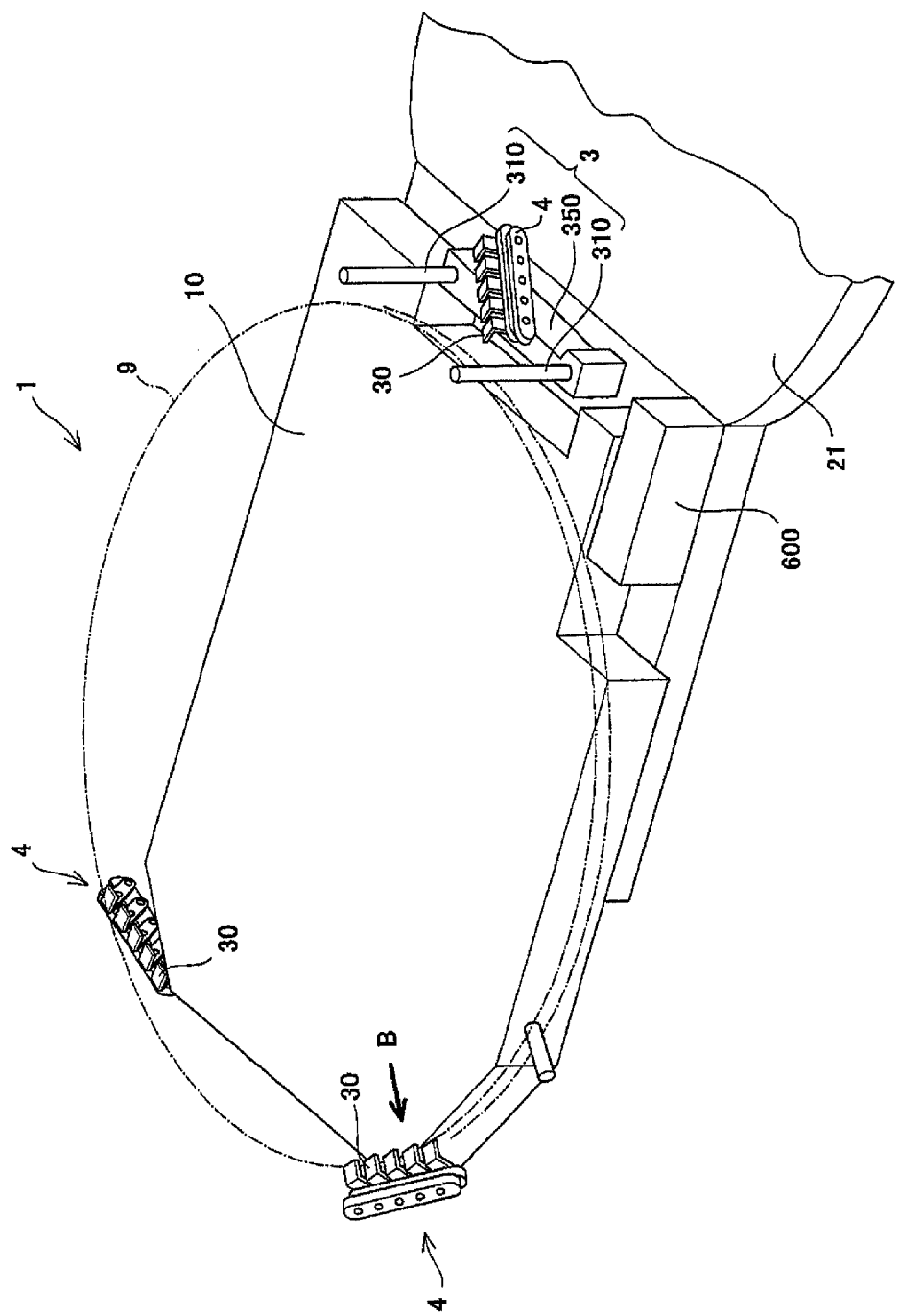
FIG. 26 is an enlarged perspective view of the end effector device according to another embodiment.

FIG. 26 is an enlarged perspective view of the end effector device 1 according to Embodiment 2. The end effector device 1 includes: the blade 10 formed in a flat plate shape and having the base end portion attached to the tip end portion of the second arm 21; two pitch changing mechanisms 4 attached to the tip end portion of the blade 10 so as to be spaced apart from each other; and the support unit 3 provided on the second arm 21 so as to be opposed to the base end portion of the blade 10. As described above, each of the pitch changing mechanisms 4 changes the upper-lower pitches of the plurality of semiconductor wafers 9 arranged so as to be spaced apart from one another in the upper-lower direction. However, the pitch changing mechanism 4 herein is different in configuration from the pitch changing mechanisms 4 of the above embodiments. The support unit 3 is configured such that: the pitch changing mechanism 4 is provided on an outer surface of a box body 350; and two first guide pins 310 are respectively provided at both sides of the pitch changing mechanism 4 so as to be each opposed to peripheral edges of the semiconductor wafers 9 with a slight gap between the first guide pin 310 and each semiconductor wafer 9. A below-described driving source unit 600 is provided on the second arm 21 so as to be located at one side of the support unit 3.

The box body 350 moves on the tip end portion of the second arm 21 by a plunger (not shown) provided at the second arm 21. Specifically, the box body 350 moves between a forward position where the box body 350 has moved toward the tip end of the blade 10 and a backward position where the box body 350 has moved toward the base end portion of the blade 10 from the forward position.

The pitch changing mechanisms 4 located at the tip end portion of the blade 10 are provided on the upper surface of the blade 10. The pitch changing mechanisms 4 may be provided anywhere as long as they are provided at the blade 10. For example, the pitch changing mechanisms 4 may be provided on the lower surface of the blade 10. However, for convenience of explanation, the pitch changing mechanism 4 is provided to extend upward from the blade 10 in the following example.

Figure 27A:
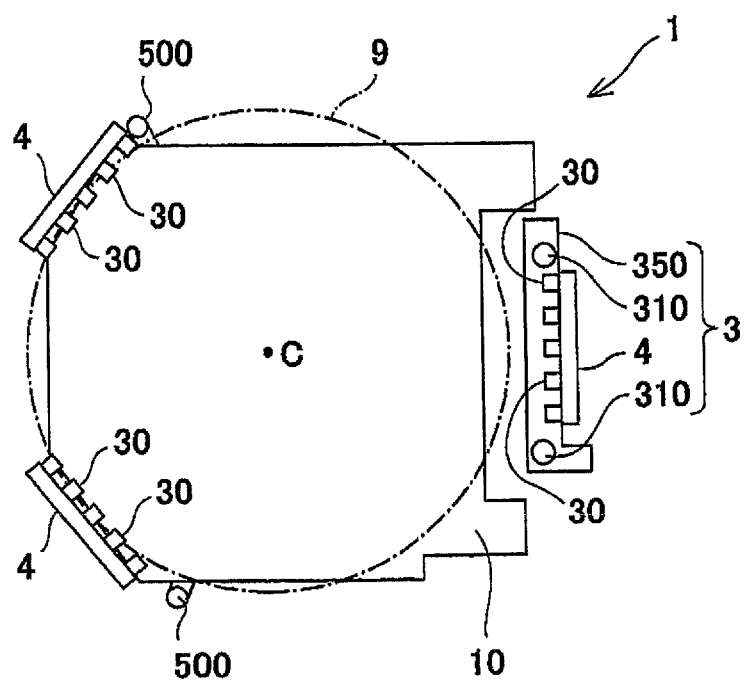
FIGS. 27A and 27B are plan views each showing a moving operation of a support unit shown in FIG. 26.
Figure 27B:
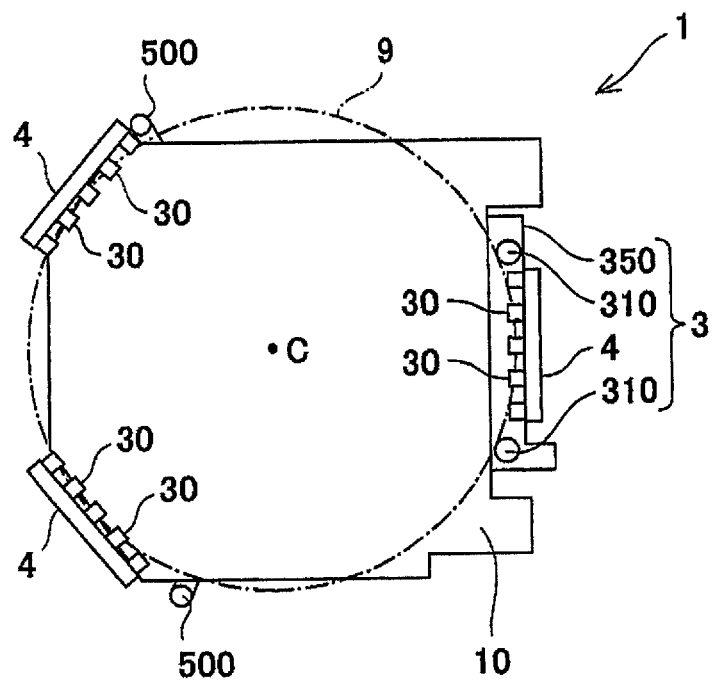

FIGS. 27A and 27B are plan views of the end effector device 1 and show the operation of the support unit 3. FIG. 27A shows the backward position, and FIG. 27B shows the forward position. Each of the pitch changing mechanisms 4 includes a plurality of nail pieces 30 arranged so as to be spaced apart from one another in the upper-lower direction and each configured to hold the peripheral portion of the semiconductor wafer 9. The shape of the nail piece 30 is the same as that in FIG. 4, and the nail piece 30 constitutes a "holding portion" in the present invention. Three nail pieces 30, located at the same height, of the pitch changing mechanisms 4 hold the peripheral portion of one semiconductor wafer 9.

At the backward position shown in FIG. 27A, the pitch changing mechanism 4 of the support unit 3 is not located at a position for holding the semiconductor wafer 9. In this state, a plurality of semiconductor wafers 9 taken out from the foup and arranged so as to be spaced apart from one another in the upper-lower direction are conveyed onto the blade 10.

When the semiconductor wafers 9 are conveyed onto the blade 10, as shown in FIG. 27B, the support unit 3 moves toward the forward position. The nail pieces 30 of the pitch changing mechanism 4 of the support unit 3 hold the peripheral portions of the semiconductor wafers 9.

As shown in FIG. 27B, three nail pieces 30, located at the same height, of the pitch changing mechanisms 4 are arranged radially relative to a center C of the semiconductor wafer 9. Since the horizontal plane at which the semiconductor wafer 9 should be located is determined by the three nail pieces 30, the semiconductor wafer 9 is substantially horizontally, stably supported by the three nail pieces 30.

At the forward position of the support unit 3 shown in FIG. 27B, two second guide pins 500 stand so as to be spaced apart from the first guide pins 310 and opposed to the peripheral edges of the semiconductor wafers 9. The reason for this will be described later.

For convenience of explanation, the foregoing has explained a case where the support unit 3 moves between the forward position and the backward position on the blade 10. However, instead of this or in addition to this, one of or both of the pitch changing mechanisms 4 may be moved in a direction toward the center of the semiconductor wafer 9 or the base end portion of the blade 10.

Embodiment 14 of Pitch Changing Mechanism

Figure 28A:
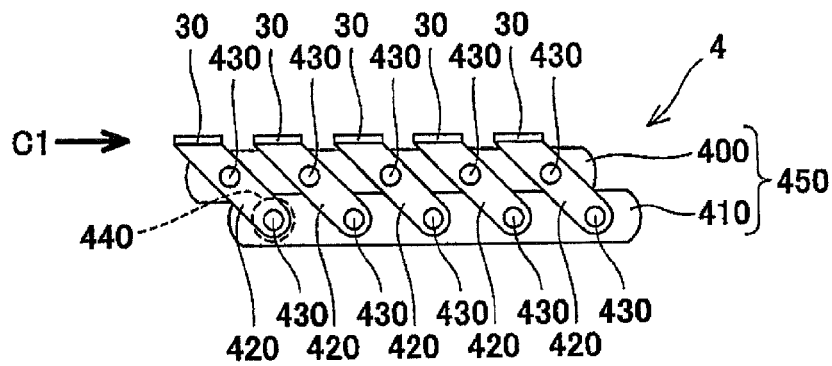
FIGS. 28A to 28C are diagrams each showing a rotating operation of the pitch changing mechanism shown in FIG. 26 and are diagrams each viewed from a direction B of FIG. 26.
Figure 28B:
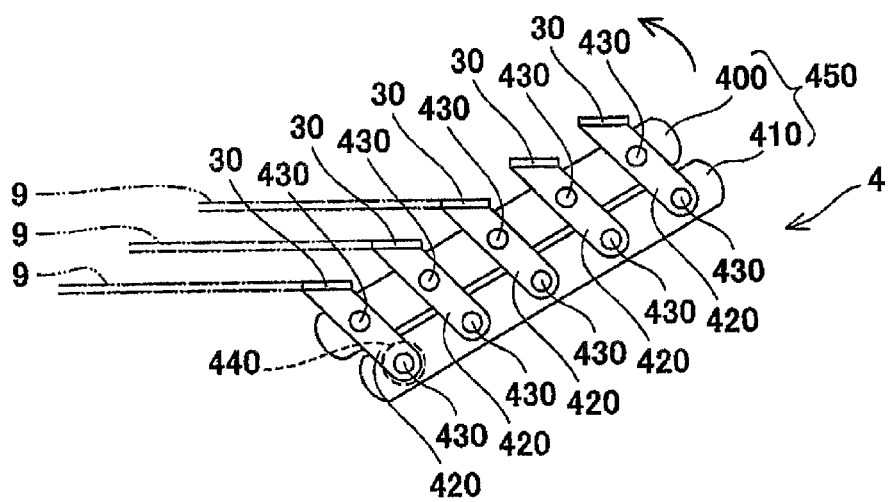
Figure 28C:
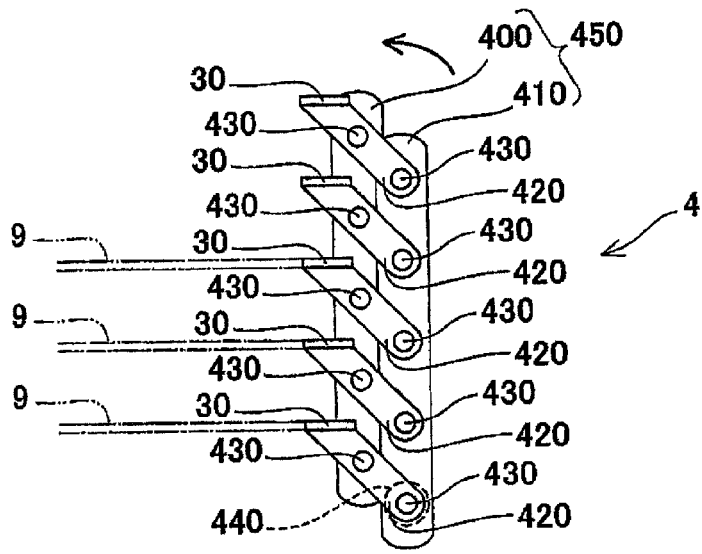

FIGS. 28A, 28B, and 28C are diagrams each showing the configuration and operation of the pitch changing mechanism 4 according to Embodiment 14, and the pitch changing mechanism 4 located at the tip end portion of the blade 10 of FIG. 26 is viewed from a direction B. The pitch changing mechanism 4 includes a rotating member 450 configured to rotate around a horizontal line in a vertical plane. The rotating member 450 includes: a first link member 400 having a long plate shape; a second link member 410 that constitutes a parallel link together with the first link member 400; and a plurality of connection link members 420 configured to couple the link members 400 and 410 to each other. The plurality of connection link members 420 are provided at regular intervals along the longitudinal direction of the link members 400 and 410.

As shown in FIG. 28A, the connection link members 420 are provided obliquely relative to the link members 400 and 410 and are attached so as to be rotatable relative to the link members 400 and 410 by rotating shafts 430 provided on the link members 400 and 410. The nail piece 30 is provided at an upper end portion of each connection link member 420 in such a posture as to be able to hold the peripheral portion of the semiconductor wafer 9. A driving shaft 440 is provided concentrically with the rotating shaft 430 provided at one end portion (left end portion in FIG. 28A) of the second link member 410. The second link member 410 rotates in a vertical plane by the rotation of the driving shaft 440.

In the state shown in FIG. 28A, the nail pieces 30 are located on substantially the same horizontal plane, and the positions of the nail pieces 30 and the link members 400 and 410 are referred to as "stand-by positions".

When the second link member 410 rotates in a counter-clockwise direction from the stand-by position by the rotation of the driving shaft 440 as shown in FIG. 28B, the first link member 400 also rotates by the connection link members 420. Since the connection link members 420 are attached to the link members 400 and 410 so as to be rotatable relative to the link members 400 and 410 by the rotating shafts 430, the connection link members 420 and the nail pieces 30 maintain postures before the rotation. The nail piece 30 located farther from the driving shaft 440 moves up more, and the upper-lower intervals each between the adjacent nail pieces 30 become larger than those in the case of the stand-by positions.

The plurality of nail pieces 30 are provided such that the pitches thereof are equal to one another. The positions of the nail pieces 30 and the link members 400 and 410 at this time are referred to as "intermediate positions".

When the second link member 410 is rotated in a counterclockwise direction from the intermediate position by the further rotation of the driving shaft 440 in the counterclockwise direction, the link members 400 and 410 become vertical states as shown in FIG. 28C. The nail pieces 30 maintain such postures as to be able to hold the peripheral portions of the semiconductor wafers 9. The pitches each between the adjacent nail pieces 30 become maximum. The positions of the nail pieces 30 and the link members 400 and 410 at this time are referred to as an "up positions". To be specific, by rotating the link members 400 and 410 in a vertical plane, the pitch changing mechanism 4 changes the pitches of the plurality of nail pieces 30 configured to hold the semiconductor wafers 9.

When the end effector device 1 is not in use, the support unit 3 is located at the backward position. The nail pieces 30 of the pitch changing mechanism 4 and the link members 400 and 410 are located at the stand-by positions.

When the end effector device 1 is in use and before a plurality of semiconductor wafers 9 are conveyed from the foup to the end effector device 1, all the pitch changing mechanisms 4 cause the nail pieces 30 to reach the up positions shown in FIG. 28C by the rotations of the driving shafts 440.

When the plurality of semiconductor wafers 9 are conveyed to the end effector device 1, the support unit 3 moves from the backward position to the forward position while maintaining the nail pieces 30 of the pitch changing mechanism 4 at the up positions. As described above, each semiconductor wafer 9 is held by three nail pieces 30 located at the same height.

From this state, the driving shaft 440 of the pitch changing mechanism 4 rotates, and the link members 400 and 410 rotate in the clockwise direction. When the nail pieces 30 reach the intermediate positions shown in FIG. 28B, the pitches each between the adjacent semiconductor wafers 9 are shortened. The first arm 20 and the second arm 21 are rotated, so that the end effector device 1 is moved to the processing shelf. Then, the semiconductor wafer 9 is processed.

According to the end effector device 1 of the present embodiment, the semiconductor wafers 9 are held by three pitch changing mechanisms 4, and the driving shafts 440 of the pitch changing mechanisms 4 rotate in synchronization with one another. A mechanism for causing the driving shafts 440 to rotate in synchronization with one another will be described later. With this, three sets of the link members 400 and 410 rotate in synchronization with one another, and the three nail pieces 30 that hold the semiconductor wafer 9 at the same height move up and down in synchronization with one another. Therefore, the semiconductor wafer 9 stably moves up and down while maintaining the posture held by the nail pieces 30.

The nail pieces 30 may be moved up and down by causing the link members 400 and 410 of the three pitch changing mechanisms 4 to rotate in the same direction. In this case, the semiconductor wafer 9 moves up and down while slightly rotating around the center C shown in FIGS. 27A and 27B. The nail pieces 30, located at the same height, of the pitch changing mechanisms 4 are displaced by the same horizontal amount when moving up and down. To be specific, the nail pieces 30 do not rub a back surface of the semiconductor wafer 9. With this, the generation of dusts generated when the nail pieces 30 rub the semiconductor wafer 9 can be prevented.

Figure 29A:
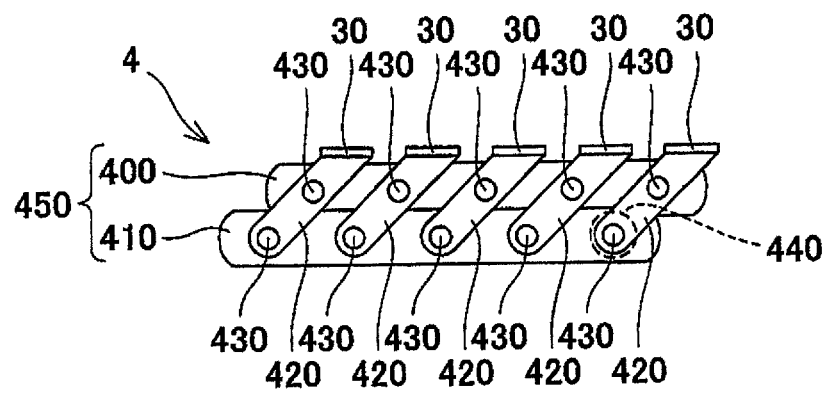
FIGS. 29A and 29B are diagrams each showing the rotating operation of another pitch changing mechanism.
Figure 29B:
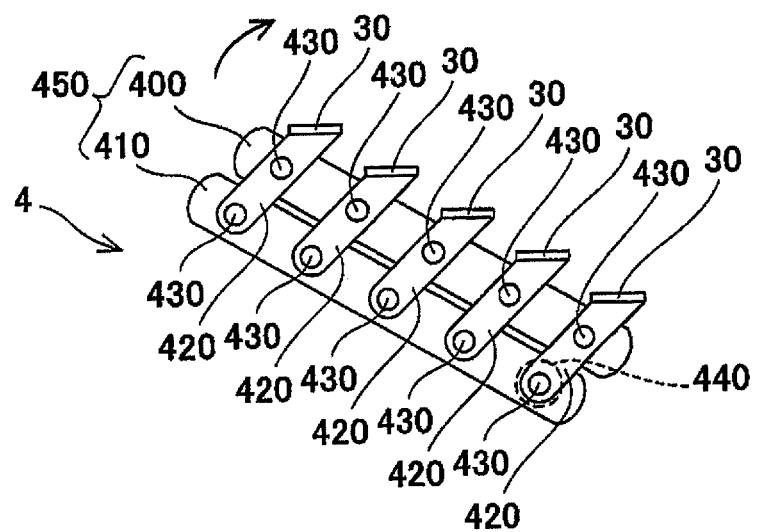

In the above explanation, to increase the pitches each between the adjacent semiconductor wafers 9, the link members 400 and 410 are rotated in the counterclockwise direction. However, instead of this, as shown in FIGS. 29A and 29B, the present embodiment may be configured such that: the driving shaft 440 is provided at the other end portion (right end portion in FIG. 29A) of the second link member 410; the connection link members 420 are inclined in a direction opposite regarding left and right to the direction in which the connection link members of FIGS. 28A and 28B are inclined; and the pitches of the plurality of nail pieces 30 are increased by the rotation of the driving shaft 440 in the clockwise direction. To be specific, when changing the pitches, the link members 400 and 410 in the pitch changing mechanism 4 shown in FIGS. 29A and 29B rotate in a direction opposite to the direction in which the link members 400 and 410 in the pitch changing mechanism 4 shown in FIGS. 28A and 28B rotate.

Then, the present embodiment may be configured such that: two out of three pitch changing mechanisms 4 are configured as shown in FIGS. 28A and 28B; and the other is configured as shown in FIGS. 29A and 29B.

In a case where the pitch changing mechanisms 4 are configured as above, and when the driving shafts 440 and the link members 400 and 410 rotate in a state where the nail pieces 30 hold the semiconductor wafer 9, the position of the semiconductor wafer 9 in the horizontal plane is displaced before and after the rotation. However, in a case where the two driving shafts 440 are rotated such that the rotation directions thereof are opposite to each other, and the link members 400 and 410 are rotated such that the rotation directions are opposite to each other, the positional displacement of the semiconductor wafer 9 in the horizontal plane is balanced out. With this, the positional displacement of the semiconductor wafer 9 in the horizontal plane can be suppressed.

Drive Mechanism of Pitch Changing Mechanism

The plurality of driving shafts 440, to be specific, three driving shafts 440 are rotated by a single motor provided in the driving source unit 600 provided on the second arm 21. A specific configuration of this will be explained below.

Figure 30:
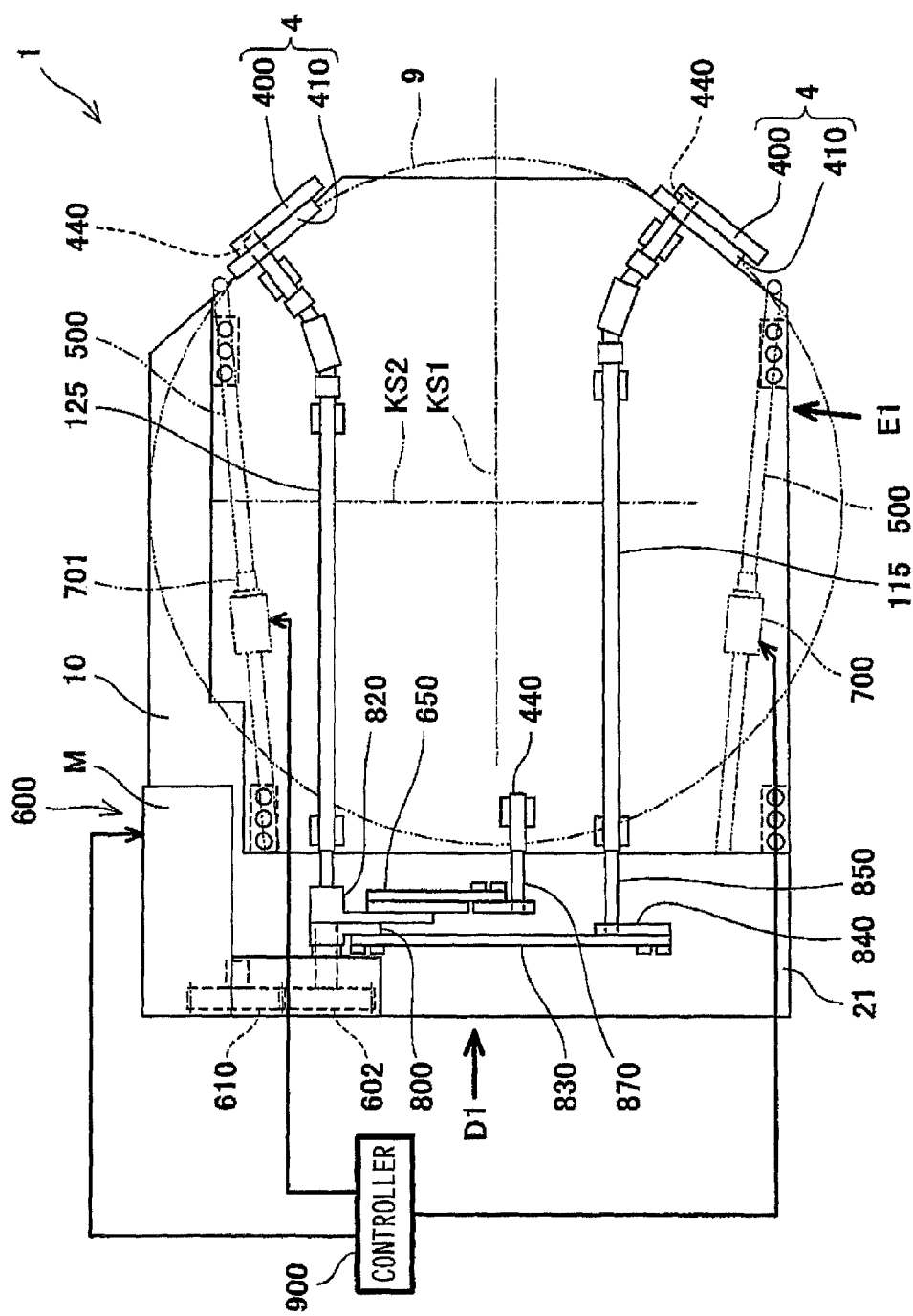
FIG. 30 is a plan view showing an internal mechanism of the end effector device.
Figure 31:
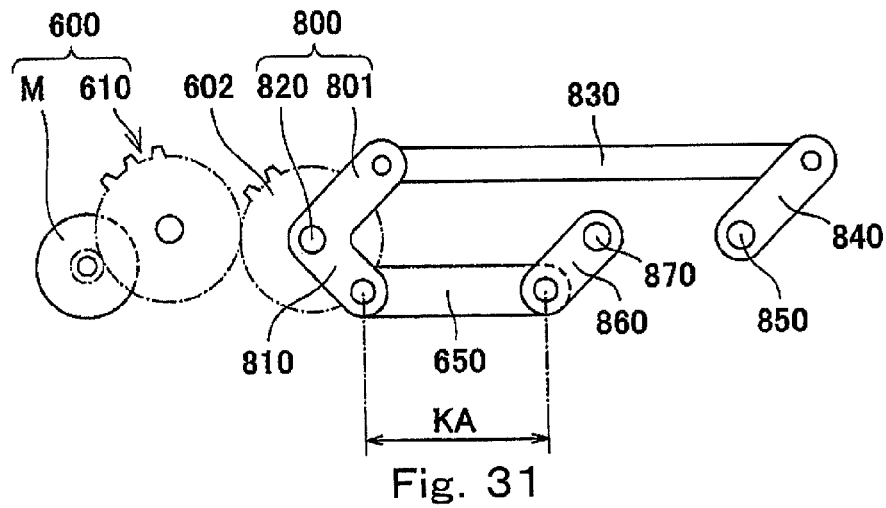
FIG. 31 is an enlarged view of a driving source unit when viewed from a direction D1 of FIG. 30.

FIG. 30 is a plan view showing an internal configuration of the end effector device 1, and FIG. 31 is an enlarged view of the driving source unit 600 when viewed from a direction D1 of FIG. 30.

The two pitch changing mechanisms 4 provided at the tip end portion of the blade 10 are arranged such that the link members 400 and 410 are inclined relative to a virtual line KS1 connecting the base end portion and tip end portion of the blade 10. The pitch changing mechanism 4 of the support unit 3 is provided such that the link members 400 and 410 are perpendicular to the virtual line KS1. A direction perpendicular to the virtual line KS1 is denoted by KS2. The two pitch changing mechanisms 4 provided at the tip end portion of the blade 10 are spaced apart from each other along the virtual line KS2.

The driving source unit 600 includes: a motor M; an intermediate gear train 610 that meshes with the motor M; a swing gear 602 located at a downstream end of the intermediate gear train 610; and a swinging member 800 having a swinging center located at a center portion of the swing gear 602. As shown in FIG. 31, the swinging member 800 includes a first leg piece 801 and a second leg piece 810 each extending in a radially outward direction of the swing gear 602 from the swinging center. The swinging member 800 swings in a plane perpendicular to the virtual line KS1.

A tip end portion of the first leg piece 801 is coupled to a free end portion of a first small link 840 via an intervening link 830 whose longitudinal direction extends along the virtual line KS2, the first small link 840 being space apart from the driving source unit 600 along the virtual line KS2. A first swinging center shaft 850 is provided at a lower end portion of the first small link 840. The first swinging center shaft 850 is connected to the driving shaft 440 of one of the pitch changing mechanisms 4, located at the tip end portion of the blade 10, via a first universal joint 115 provided along the virtual line KS1. The first universal joint 115 extends from the first swinging center shaft 850 along the virtual line KS1 and is then inclined relative to the virtual line KS1 toward the pitch changing mechanism 4.

A tip end portion of the second leg piece 810 of the swinging member 800 is coupled to a free end portion of a second small link 860 via a linear guide member 650 whose longitudinal direction extends along the virtual line KS2, the second small link 860 being located between the swinging member 800 and the first small link 840. An interval (KA in FIG. 31) between a portion where the linear guide member 650 and the second leg piece 810 are coupled to each other and a portion where the linear guide member 650 and the second small link 860 are coupled to each other is extendable as described below.

A second swinging center shaft 870 is provided at one end portion of the second small link 860 and connected to the driving shaft 440 of the pitch changing mechanism 4 of the support unit 3.

A third swinging center shaft 820 provided concentrically with the swinging center of the swinging member 800 is connected to the driving shaft 440 of the other pitch changing mechanism 4, located at the tip end portion of the blade 10, via a second universal joint 125 extending along the virtual line KS1. The second universal joint 125 extends from the third swinging center shaft 820 along the virtual line KS1 and is then inclined relative to the virtual line KS1 toward the other pitch changing mechanism 4.

A first air cylinder 700 is provided outside the first universal joint 115, and a second air cylinder 701 is provided outside the second universal joint 125. Operations of the first and second air cylinders 700 and 701 will be described later. The operations of the motor M and the air cylinders 700 and 701 are controlled by a controller 900 provided outside the blade 10.

As shown in FIG. 30, the pitch changing mechanism 4 of the support unit 3 is configured such that the driving shaft 440 is provided at the right end portion of the second link member 410 as shown in FIG. 29A. Each of the two pitch changing mechanisms 4 provided at the tip end portion of the blade 10 is configured such that the driving shaft 440 is provided at the left end portion of the second link member 410 as shown in FIG. 28A. To be specific, to cause the nail pieces 30 and the semiconductor wafers 9 to move up and down, the rotation direction of the driving shaft 440 of the pitch changing mechanism 4 of the support unit 3 and the rotation direction of each of the driving shafts 440 of the pitch changing mechanisms 4 provided at the tip end portion of the blade 10 need to be opposite to each other.

Driving Force Transmitting Operation

Figure 32A:
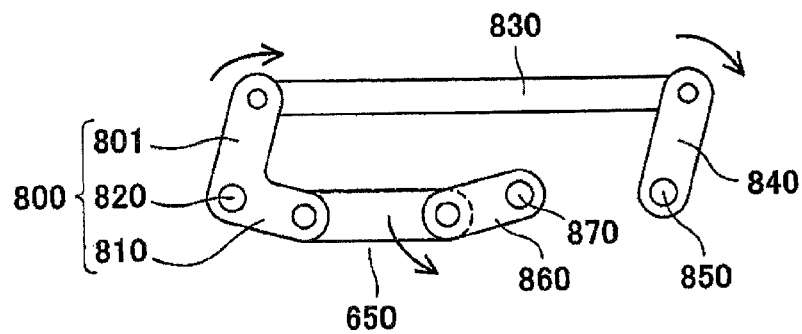
FIGS. 32A and 32B are diagrams each showing a rotating operation of a swinging member.
Figure 32B:
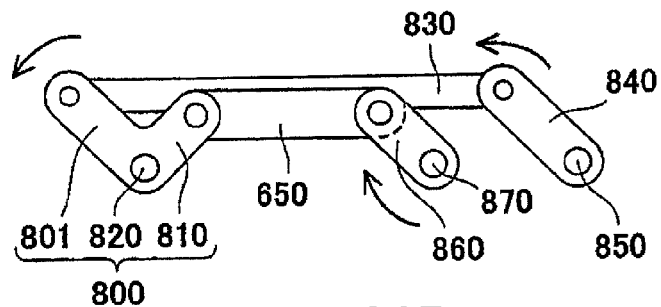

As described above, when the support unit 3 is located at the forward position, the nail pieces 30 are located at the up positions (FIG. 28C). To shorten the pitches by rotating the motor M to move the nail pieces 30 from the up positions to the intermediate positions (FIG. 28B), the following operations are performed. FIGS. 32A and 32B are diagrams each showing the rotating operation of the swinging member 800.

The controller 900 supplies electric power to the motor M to cause the motor M to rotate. As shown in FIG. 32A, the swinging member 800 swings in the clockwise direction by the rotation of the motor M. The third swinging center shaft 820 of the swinging member 800 causes the driving shaft 440 of the pitch changing mechanism 4, located at the tip end portion of the blade 10, to rotate in the clockwise direction.

The first leg piece 801 of the swinging member 800 causes the first small link 840 to rotate in the clockwise direction via the intervening link 830. The first swinging center shaft 850 rotates by the rotation of the first small link 840 to cause the driving shaft 440 of the pitch changing mechanism 4, located at the tip end portion of the blade 10, to rotate in the clockwise direction via the first universal joint 115.

The second leg piece 810 of the swinging member 800 causes the second small link 860 to rotate in the counterclockwise direction via the linear guide member 650. The second swinging center shaft 870 of the second small link 860 causes the driving shaft 440 of the pitch changing mechanism 4 of the support unit 3 to rotate in the counterclockwise direction. The linear guide member 650 is located lower than the third swinging center shaft 820 of the swinging member 800.

Since the pitch changing mechanism 4 located at the tip end portion of the blade 10 is configured as shown in FIG. 28A, the pitches each between the adjacent nail pieces 30 are shortened by the rotation of the driving shaft 440 in the clockwise direction. In contrast, since the pitch changing mechanism 4 of the support unit 3 is configured as shown in FIG. 29A, the pitches each between the adjacent nail pieces 30 are shortened by the rotation of the driving shaft 440 in the counterclockwise direction.

To increase the pitches each between the adjacent nail pieces 30, an operation opposite to the above operation is performed. To be specific, as shown in FIG. 32B, the swinging member 800 is caused to swing in the counterclockwise direction. The first small link 840 connected to the first leg piece 801 via the intervening link 830 rotates also in the counterclockwise direction. By the rotations of the third swinging center shaft 820 and the first swinging center shaft 850 in the counterclockwise direction, the pitches each between the adjacent nail pieces 30 of the pitch changing mechanism 4 located at the tip end portion of the blade 10 increase.

In contrast, the second small link 860 rotates in the clockwise direction. The second swinging center shaft 870 rotates in the clockwise direction to cause the driving shaft 440 of the pitch changing mechanism 4 of the support unit 3 to rotate in the clockwise direction. Thus, the pitches each between the adjacent nail pieces 30 increase.

Herein, when the second small link 860 rotates in the clockwise direction, the linear guide member 650 moves from a position lower than the third swinging center shaft 820 to a position higher than the third swinging center shaft 820. To be specific, when the second small link 860 rotates in the clockwise direction, the distance (KA in FIG. 31) between the free end portion of the second leg piece 810 and the free end portion of the second small link 860 changes.

Figure 33:
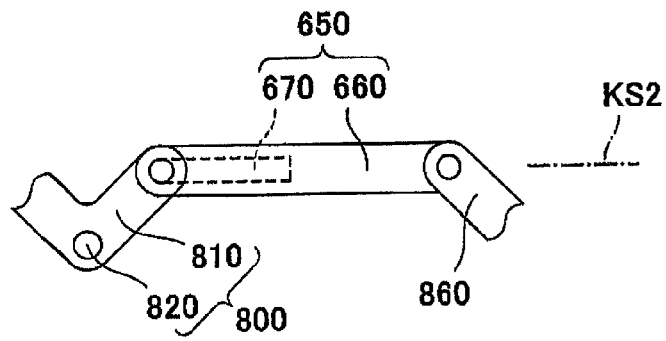
FIG. 33 is a diagram showing the configuration of a linear guide member.

To deal with this, as shown in FIG. 33, the linear guide member 650 is configured such that a moving piece 670 that is movable along the virtual line KS2 is provided in a main body 660 extending along the virtual line KS2 (see FIG. 10). The free end portion of the second small link 860 is attached to one end portion of the main body 660 such that the second small link 860 is rotatable, and the free end portion of the second leg piece 810 is attached to the moving piece 670 such that the second leg piece 810 is rotatable. With this, even in a case where the distance between the free end portion of the second leg piece 810 and the free end portion of the second small link 860 changes, the rotation of the swinging member 800 can be accurately transferred to the second small link 860. The free end portion of the second small link 860 and the free end portion of the second leg piece 810 may be connected to each other via a linear motion guide.

According to the end effector device 1 of the present embodiment, the single motor M causes the three driving shafts 440 to rotate in synchronization with one another to perform the pitch changing operations of the three pitch changing mechanisms 4. With this, it is unnecessary to provide a large number of motors M in accordance with the number of pitch changing mechanisms 4. Thus, the manufacturing cost of the entire end effector device 1 can be suppressed.

The driving source unit 600 is provided closer to the base end portion of the robot arm than the blade, that is, provided on the second arm 21. With this, the weight of the driving source unit 600 is not applied to the tip end portion of the robot arm. Therefore, the weight on the tip end portion of the robot arm can be reduced, and the tip end portion of the robot arm can operate smoothly.

Each of the two pitch changing mechanisms 4 located at the tip end portion of the blade 10 is not arranged along the virtual line KS1 (see FIG. 30) from the driving source unit 600. Therefore, it is difficult to connect the driving source unit 600 to each of the two pitch changing mechanisms 4 by a linear member. However, the driving source unit 600 can be connected to the two pitch changing mechanisms 4 by using the first and second universal joints 115 and 125. With this, the force of the driving source unit 600 can be transmitted to the two pitch changing mechanisms 4.

Standing Operation of Guide Pin

As described above, when the nail pieces 30 move up and down by the rotations of the link members 400 and 410, the position of the semiconductor wafer 9 in the horizontal plane may be displaced before or after the rotations. In this case, the semiconductor wafers 9 cannot be accurately conveyed to the processing shelf in the processing booth. Here, as shown in FIG. 27B, in a state where the support unit 3 is located at the forward position and the nail pieces 30 hold the peripheral edges of the semiconductor wafers 9, and before the link members 400 and 410 rotate to cause the nail pieces 30 to move up and down, the first and second guide pins 310 and 500 are caused to be located at positions slightly spaced apart from the peripheral edges of the semiconductor wafers 9. Thus, the positional displacement of each semiconductor wafer 9 in the horizontal plane is prevented.

To be specific, after the nail pieces 30 hold the peripheral edges of the semiconductor wafers 9, the first and second guide pins 310 and 500 are caused to be located at the peripheral edge of the semiconductor wafer 9. Then, the pitches each between the adjacent nail pieces 30 are changed. After the pitches each between the adjacent nail pieces 30 are changed, the first and second guide pins 310 and 500 are pulled back, and the support unit 3 is then moved backward. These operations are controlled by the controller 900 (FIG. 30).

As described above, the first guide pins 310 are provided at the support unit 3, and when the support unit 3 is located at the forward position, the first guide pins 310 are positioned at the peripheral edge of the semiconductor wafer 9. In a state where the nail pieces 30 hold the peripheral edges of the semiconductor wafers 9, the second guide pins 500 project from the lower surface of the blade 10 by the first and second air cylinders 700 and 701. Hereinafter, a mechanism of causing the second guide pins 500 to project from the lower surface of the blade 10 will be explained.

Figure 34A:
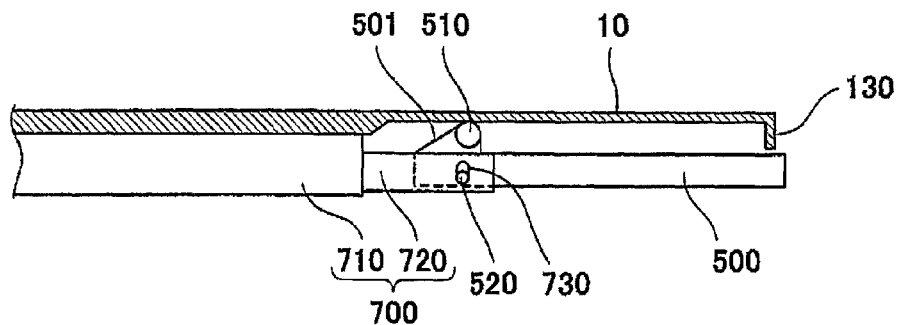
FIGS. 34A to 34C are side views each showing a first air cylinder when viewed from a direction E1 of FIG. 30.
Figure 34B:
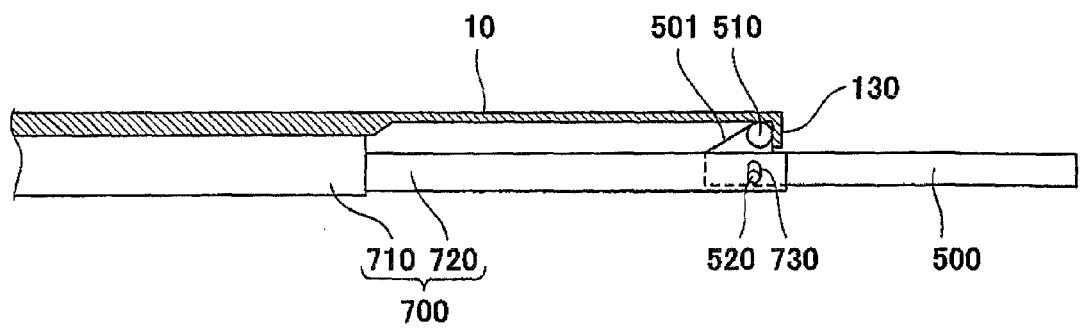
Figure 34C:
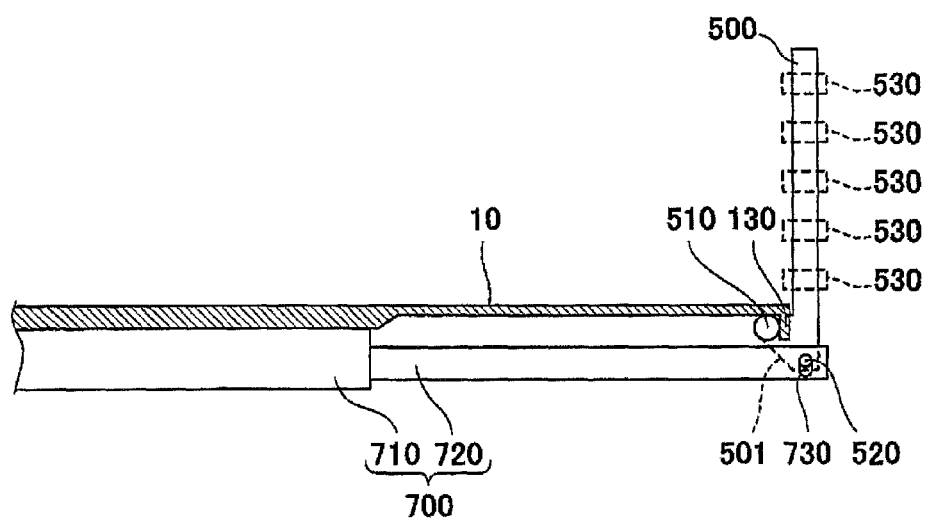

FIGS. 34A, 34B, and 34C are side views each showing the first air cylinder 700 when viewed from a direction E1 of FIG. 30. For convenience of explanation, the members located on the upper surface of the blade 10 are not shown. The second air cylinder 701 is the same in configuration as the first air cylinder 700. As shown in FIG. 34A, the first air cylinder 700 is configured such that a piston 720 is projectable from a housing 710 in a horizontal plane. A vertical hole 730 is formed at a tip end portion of the piston 720. The second guide pin 500 is horizontally provided under the blade 10 and at a projecting side of the piston 720. A contact member 501 is provided at a base end portion of the second guide pin 500. A contact roller 510 is provided at an upper end portion of the contact member 501, and a small shaft 520 fitted in the vertical hole 730 projects from the contact member 501. A contact wall 130 is provided at the blade 10 so as to correspond to a maximum projection amount of the piston 720. In the state shown in FIG. 34A, the second guide pin 500 is in a horizontal prone posture, and the small shaft 520 is located at a lower end portion of the vertical hole 730.

As shown in FIG. 34B, the piston 720 projects from the housing 710, and the contact roller 510 of the contact member 500 contacts the contact wall 130. With this, a further movement of the second guide pin 500 in the horizontal direction is prevented.

As shown in FIG. 34C, when the piston 720 further projects from the housing 710 to push the second guide pin 500, the second guide pin 500 upwardly rotates around the contact roller 510 due to the prevention of the forward movement of the second guide pin 500. Since the second guide pin 500 rotates upwardly, the small shaft 520 of the second guide pin 500 moves to an upper end portion of the vertical hole 730. The second guide pin 500 becomes in a standing posture whose axial direction corresponds to the vertical direction. When storing the second guide pin 500 in the housing 710, the piston 720 is pulled back, and an operation opposite to the above operation is performed. As shown in FIG. 34C, guide rings 530 that are buffer bodies may be provided at the second guide pin 500 so as to correspond to the heights of the semiconductor wafers 9.

Figure 35A:
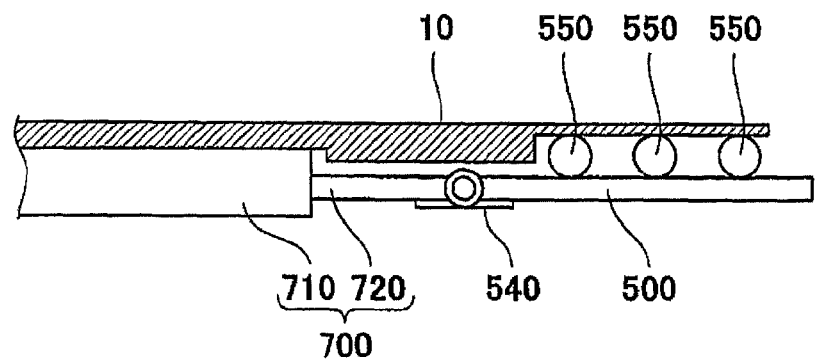
FIGS. 35A and 35B are side views each showing another mechanism of causing a second guide pin to project from a lower surface of a blade.
Figure 35B:
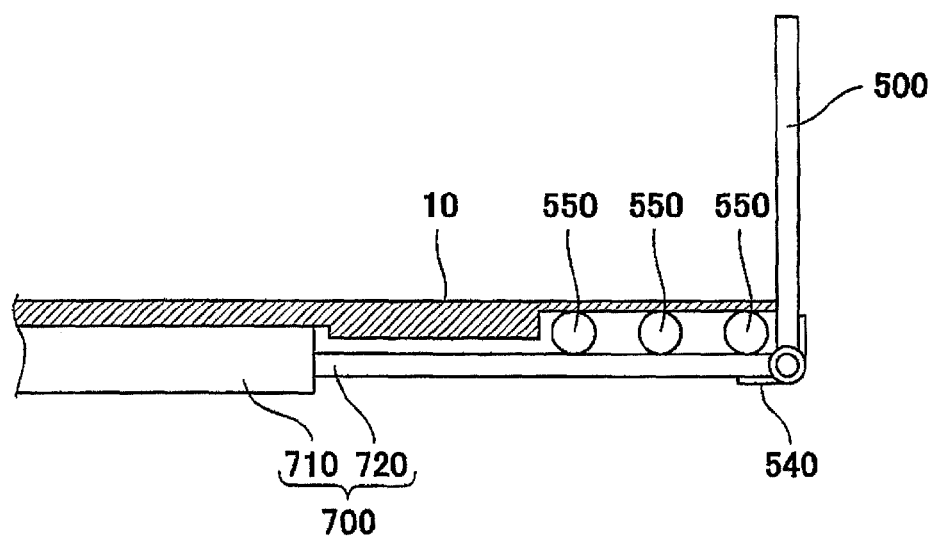

FIGS. 35A and 35B are side views each showing another mechanism of causing the second guide pin 500 to project from the lower surface of the blade 10. For convenience of explanation, the members located on the upper surface of the blade 10 are not shown. A base end portion of the second guide pin 500 is attached to a tip end portion of the piston 720 such that the second guide pin 500 is rotatable. At this attachment portion, a torsion spring 540 configured to bias the second guide pin 500 in the counterclockwise direction is provided. A plurality of rollers 550 each having a lower end contacting the second guide pin 500 are attached to the lower surface of the blade 10. As shown in FIG. 35A, in a state where the piston 720 is being pulled back in the housing 710, the second guide pin 500 is being pressed by the rollers 550. The second guide pin 500 maintains its prone posture against the biasing force of the torsion spring 540.

As shown in FIG. 35B, when the piston 720 projects from the housing 710, the second guide pin 500 is pushed to be gradually separated from the rollers 550. When the second guide pin 500 is completely separated from the rollers 550, the second guide pin 500 becomes the standing posture by the biasing force of the torsion spring 540 as shown in FIG. 35B. When storing the second guide pin 500 in the housing 710, the piston 720 is pulled back, and the second guide pin 500 is caused to return to the prone posture against the biasing force of the torsion spring 540.

The end effector devices according to the above embodiments are advantageous as below.

1. The above embodiments have realized the mechanism in which the incorporated support unit has a pitch changing function, and the edge grip type end effector device changes the pitch. In addition, according to the present invention, the blade is a member including at least one support unit, and one support unit is enough. Therefore, the weight and cost of the end effector device are reduced.

2. Three nail pieces 30, located at the same height, of the support units 3 are arranged radially relative to the center C of the semiconductor wafer 9 (see FIGS. 3, 27A, and 27B). Since the horizontal plane at which the semiconductor wafer 9 should be located is determined by the three nail pieces 30, the semiconductor wafer 9 is substantially horizontally, stably supported by the three nail pieces 30.

3. In a part of the embodiments, the driving source configured to cause the pitch changing mechanism 4 to operate is provided outside the blade 10 and at the base end portion side of the second arm 21. To be specific, the driving source is not provided in or on the blade 10. Therefore, the pitch changing mechanism 4 can be reduced in size so as to be suitable for the incorporation into the end effector device 1.

Since the weight of the driving source is not applied to the tip end portion of the second arm 21, the weight on the tip end portion of the second arm 21 can be reduced, and the tip end portion of the second arm 21 can operate smoothly. However, it is not essential to provide each driving source at the base end portion side of the second arm 21. The driving source may be provided anywhere. For example, the driving source may be provided in or on the blade 10.

Embodiment 15 of Pitch Changing Mechanism

A below-described simple mechanism may be used as the mechanism configured to change the pitches each between the adjacent semiconductor wafers 9 by causing the link members to rotate in a vertical plane.

Figure 36A:
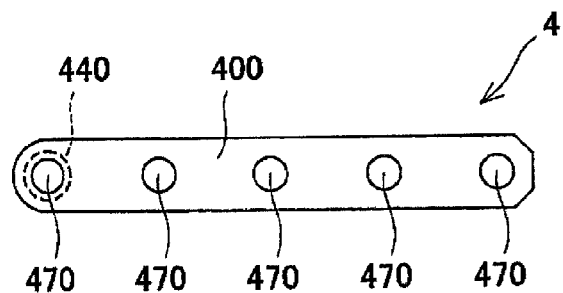
FIGS. 36A to 36C are diagrams each showing yet another pitch changing mechanism.
Figure 36B:
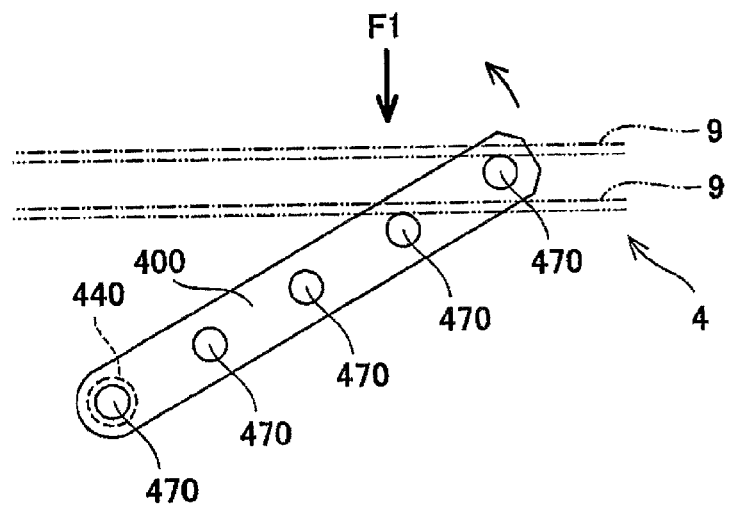
Figure 36C:
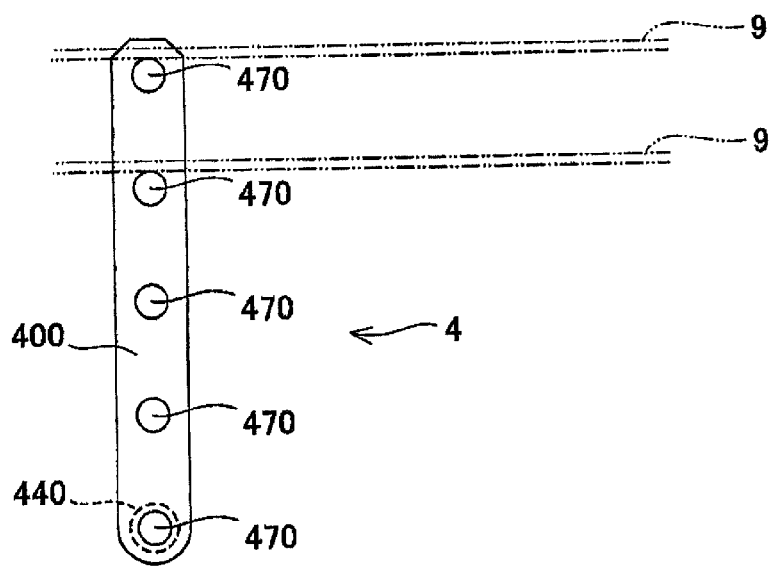
Figure 37:
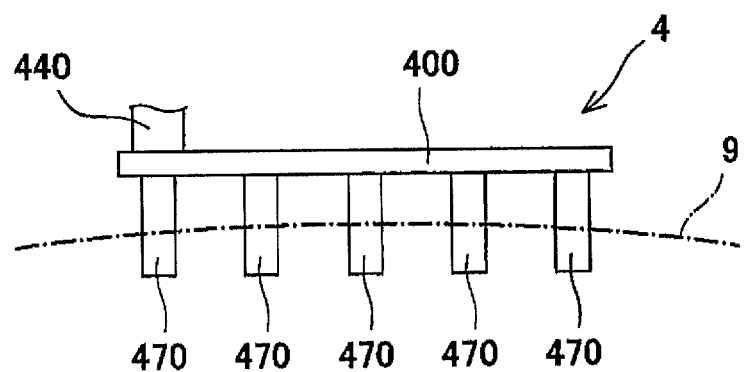
FIG. 37 is a diagram when viewed from a direction F1 of FIG. 36B.

FIGS. 36A, 36B, and 36C are diagrams each showing yet another pitch changing mechanism 4, and FIG. 37 is a diagram when viewed from a direction F1 of FIG. 36B. In the present embodiment, the driving shaft 440 is provided at one end portion (left end portion in FIGS. 36A, 36B, and 36C) of the first link member 400, and a plurality of shaft bodies 470 each having a circular cross section and configured to receive the lower surface of the semiconductor wafer 9 are provided at regular intervals along the longitudinal direction of the first link member 400. To be specific, the shaft body 470 constitutes the "holding portion" of the present invention. In the stand-by positions shown in FIG. 36A, all the shaft bodies 470 are located in the horizontal plane.

As shown in FIG. 36B, when the first link member 400 rotates in the counterclockwise direction from the stand-by position by the rotation of the driving shaft 440, the shaft body 470 located farther from the driving shaft 440 moves up more, and the upper-lower intervals each between the adjacent shaft bodies 470 become larger than those in the case of the stand-by positions. The plurality of shaft bodies 470 are provided such that the upper-lower intervals each between the adjacent shaft bodies 470 are equal to one another. The shaft bodies 470 reach the intermediate positions. As shown in FIG. 37, the first link member 400 is spaced apart from the semiconductor wafer 9 so as not to rub the semiconductor wafer 9.

When the first link member 400 rotates in the counterclockwise direction from the intermediate position by the further rotation of the driving shaft 440, the first link member 400 becomes a vertical state as shown in FIG. 36C. The pitches each between the adjacent shaft bodies 470 become maximum. The shaft bodies 470 reach the up positions.

Until the shaft bodies 470 reach the up positions from the stand-by positions, the shaft bodies 470 move up while rubbing the back surface of the semiconductor wafer 9. Therefore, it is desirable that the shaft bodies 470 be made of a material that causes little friction with the semiconductor wafer 9. However, the present embodiment is not limited to this.

The pitch changing mechanism 4 shown in FIGS. 36A, 36B, and 36C cannot inwardly push the peripheral portions of the semiconductor wafers 9.

Figure 38:
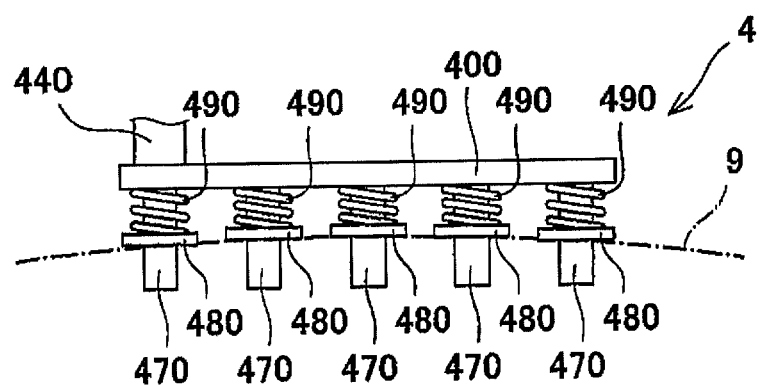
FIG. 38 is a diagram showing still another pitch changing mechanism.

However, as shown in FIG. 38 for example, the present embodiment may be configured such that: contacting members 480 that contact the peripheral edges of the semiconductor wafers 9 are respectively provided at the shaft bodies 470; each of pushing springs 490 is provided between the contacting member 480 and the first link member 400; and the contacting members 480 are caused to push the peripheral edges of the semiconductor wafers 9. With this, the pitch changing mechanism 4 can be suitably applied to the edge grip type end effector device 1.

Figure 39:
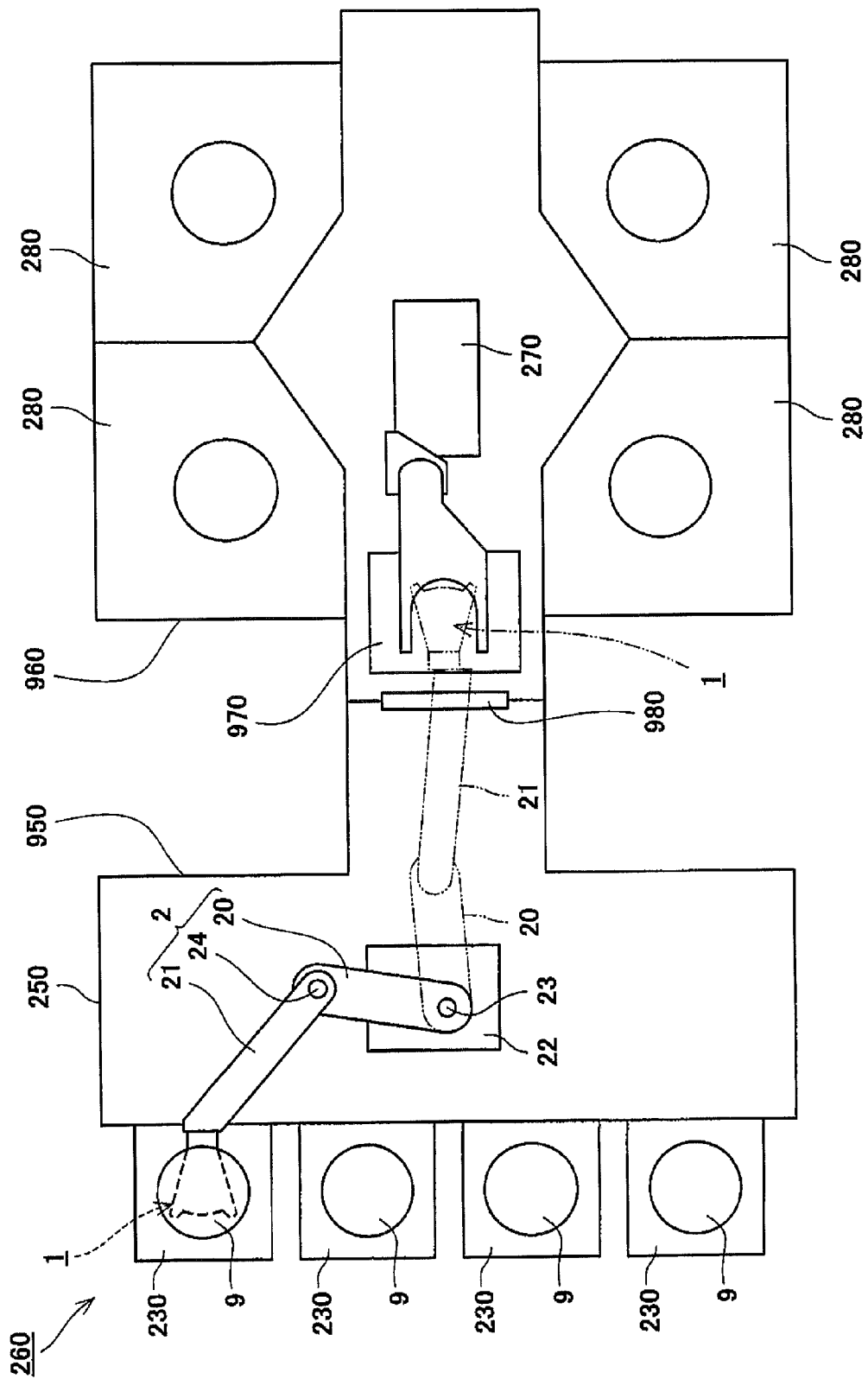
FIG. 39 is a plan view showing a substrate processing device including the substrate conveying robot of FIG. 1 and a substrate processing facility including the substrate processing device.

FIG. 39 is a plan view showing a substrate processing device 250 at which the substrate conveying robot 2 shown in FIG. 1 is provided and a substrate processing facility 260 including the substrate processing device 250. The substrate processing device 250 is configured such that a below-described second casing 960 is provided at one side portion of a first casing 950 configured to house the substrate conveying robot 2. A plurality of foups 230 are provided at the other side portion of the first casing 950. The plurality of foups 230 are lined up in a direction perpendicular to a direction in which the semiconductor wafers 9 get in and out of the foups 230.

A door 980 is provided at a boundary between the second casing 960 and the first casing 950. The first casing 950 is maintained at atmospheric pressure whereas the second casing 960 is maintained in a substantially vacuum state by the door 980. A delivery region 970 to which a plurality of semiconductor wafers 9 having been conveyed by the substrate conveying robot 2 reach through the door 980 is formed at the second casing 960 side of the door 980.

A hand device 270 is provided at a middle portion in the second casing 960, and four processing shelves 280 are provided in the second casing 960 so as to surround the hand device 270. The hand device 270 holds the plurality of semiconductor wafers 9, having reached the delivery region 970, to convey the semiconductor wafers 9 to the processing shelves 280 and conveys the semiconductor wafer 9, having been subjected to processing in one processing shelf 280, to another processing shelf 280. The number of processing shelves 280 in the second casing 960 is not limited to four.

The substrate processing device 260 includes a plurality of substrate processing devices 250 and performs the entire semiconductor manufacturing process or a part of the semiconductor manufacturing process.

Since the inside of the second casing 960 is maintained in a vacuum state as described above, the processing can be performed under clean circumstances.

The substrate processing robot 2 holds a plurality of semiconductor wafers 9 in the foup 230 by the end effector device 1 provided at the tip end portion thereof. When the substrate processing robot 2 has taken out a plurality of semiconductor wafers 9, which are spaced apart from one another in the upper-lower direction, from the foup 230, the substrate processing robot 2 rotates around the arm supporting portion 23 to cause the end effector device 1, which is holding the semiconductor wafers 9, to reach the delivery region 970. In a period from when the semiconductor wafers 9 have been taken out from the foup 230 until when the semiconductor wafers 9 reach the delivery region 970, the pitch changing mechanisms 4 (see FIG. 2) of the end effector device 1 are activated to shorten the pitches each between the adjacent semiconductor wafers 9. The plurality of semiconductor wafers 9 whose pitches have been shortened and which have been conveyed to the delivery region 970 are conveyed to the processing shelves 280 by the hand device 270.

INDUSTRIAL APPLICABILITY

The present invention is useful for all the end effector devices each including a mechanism configured to support a plurality of plate-shaped members that are spaced apart from one another in an upper-lower direction and parallel to one another and also configured to change the intervals of the plate-shaped members.

REFERENCE SIGNS LIST

1 end effector device
3 support unit
4 pitch changing mechanism
5 operating mechanism
6 fixed shaft
7 swinging plate
8 cylindrical body
9 semiconductor wafer
10 blade
20 first arm
21 second arm
30 nail piece
55 air cylinder
60 extendable shaft
80 spiral groove

The invention claimed is:

1. An end effector device attached to a tip end portion of a robot arm,
the end effector device comprising:
a blade including a base end portion and a tip end portion; and
a support unit provided at the blade and configured to support peripheral portions of a plurality of plate-shaped members such that the plate-shaped members are parallel to one another and spaced apart from one another in an upper-lower direction and also configured to change intervals of the plate-shaped members,
wherein the support unit is one of a plurality of support units, and each of the support units includes:
a plurality of nail pieces arranged so as to be spaced apart from one another in the upper-lower direction and configured to support the peripheral portions of the plate-shaped members such that the plate-shaped members are parallel to one another and spaced apart from one another in the upper-lower direction; and
a pitch changing mechanism configured to support the plurality of nail pieces and change upper-lower intervals of the plurality of nail pieces,
wherein:
the plurality of nail pieces include a plurality of movable nail pieces; and
the pitch changing mechanism includes
one or more elastic members provided at the blade and configured to support the plurality of movable nail pieces such that the movable nail pieces are spaced apart from one another in the upper-lower direction and also configured to elastically deform in the upper-lower direction, and
an operating mechanism configured to cause said one or more elastic members to elastically deform in the upper-lower direction.

2. The end effector device according to claim 1, wherein:
said one more elastic members are configured as one coil spring that expands in the upper-lower direction; and
the plurality of movable nail pieces are provided at the coil spring so as to be spaced apart from one another in the upper-lower direction.

3. The end effector device according to claim 1, wherein:
said one more elastic members are configured as a plurality of coil springs, each of which integrally includes the movable nail piece and expands in the upper-lower direction; and
the plurality of coil springs are stacked on the blade to form plural stages and coupled to one another.

4. The end effector device according to claim 1, wherein:
said one more elastic members are configured as a plurality of linear springs configured to elastically deform in the upper-lower direction; and
the plurality of linear springs and the plurality of movable nail pieces are alternately arranged such that each of the linear springs is supported by the movable nail piece located immediately below this linear spring or supports the movable nail piece located immediately above this linear spring.

5. The end effector device according to claim 1, wherein the plurality of nail pieces includes the plurality of movable nail pieces and a fixed nail piece fixed to the blade and located at a lowest position.

6. The end effector device according to claim 1, wherein the operating mechanism includes:
a fixed shaft standing on the blade; and
an extendable shaft connected to at least one of the movable nail pieces, guided by the fixed shaft so as to move up and down, and configured to cause said one more elastic members, connected to the movable nail piece, to expand and contract by the up-and-down movements.

7. The end effector device according to claim 6, wherein:
the pitch changing mechanism includes a driving source configured to supply a driving force to the operating mechanism; and
the driving source is provided closer to a base end portion of the robot arm than the blade.

8. The end effector device according to claim 7, wherein the pitch changing mechanism is configured to change the upper-lower intervals of the plurality of nail pieces by the driving force acting in the upper-lower direction and also configured to convert the driving force of the driving source acting in a horizontal forward direction into the driving force acting in the upper-lower direction.

9. The end effector device according to claim 7, wherein the pitch changing mechanism is configured to change the upper-lower intervals of the plurality of nail pieces by the driving force acting in the upper-lower direction and also configured to convert a rotational force of the driving source around a horizontal axis of the driving source into the driving force acting in the upper-lower direction.

10. The end effector device according to claim 7, wherein the pitch changing mechanism is configured to change the upper-lower intervals of the plurality of nail pieces by the driving force acting in the upper-lower direction and also configured to convert a rotational force of the driving source around a vertical axis of the driving source into the driving force acting in the upper-lower direction.

11. The end effector device according to claim 6, wherein the pitch changing mechanism includes a cylinder provided at the blade and configured to cause the extendable shaft to move up and down.

12. A substrate conveying robot comprising the end effector device according to claim 1.

13. The end effector device according to claim 1, wherein:
the plurality of support units include one or more base end support units located closest to a base end of the blade;
said one or more base end support units are configured to move forward and backward along a line connecting the base end and a tip end of the blade; and
the base end support unit at a forward position and the support unit opposed to the base end support unit press and hold the peripheral portions of the plurality of plate-shaped members.

14. The end effector device according to claim 13, wherein:
the plurality of support units include one or more tip end support units opposed to the base end support unit and fixed to the blade; and
the base end support unit at the forward position and said one or more tip end support units hold the plurality of plate-shaped members.

15. An end effector device attached to a tip end portion of a robot arm,
the end effector device comprising:
a blade including a base end portion and a tip end portion; and
a support unit provided at the blade and configured to support peripheral portions of a plurality of plate-shaped members such that the plate-shaped members are parallel to one another and spaced apart from one another in an upper-lower direction and also configured to change intervals of the plate-shaped members, wherein:
a plurality of pitch changing mechanisms are provided at the blade;
each of the plurality of pitch changing mechanisms includes holding portions, which are provided so as to be spaced apart from one another in a direction perpendicular to axes of the holding portions, each of the axes extending in one flat plane, and are configured to respectively hold peripheral portions of the plurality of plate-shaped members;
each of the plurality of pitch changing mechanisms changes intervals of the plurality of plate-shaped members, the intervals being formed in a direction perpendicular to said one flat plane;
at least one of the pitch changing mechanisms is provided at the support unit and is configured to move forward to the tip end portion of the blade and move backward to the base end portion of the blade;
said one of the pitch changing mechanisms holds the plate-shaped members at a position where said one of the pitch changing mechanisms has moved forward to the tip end portion of the blade and releases the plate-shaped members at a position where said one of the pitch changing mechanisms has moved backward to the base end portion of the blade;
each of the pitch changing mechanisms includes a plurality of rotating members provided so as to rotate in synchronization with one another around the axes of the corresponding holding portions;
the holding portions are provided at the rotating members so as to be spaced apart from one another in a direction perpendicular to the axes of the holding portions;
each of the pitch changing mechanisms is configured to change the intervals of the plurality of plate-shaped members by rotations of the rotating members.

16. The end effector device according to claim 15, wherein:
each of the pitch changing mechanism includes
parallel link members, each of which constitutes a parallel link together with the rotating member used as the other parallel link member, and
connection link members connecting these parallel link members; and
the holding portions are respectively provided at the connection links so as to each include a receiving portion configured to receive the peripheral portion of the corresponding plate-shaped member in parallel with said one flat plane.

17. The end effector device according to claim 15, further comprising a guide member provided at the blade and configured to take a forward posture in which a guide surface of the guide member is located in the vicinity of a side edge of the plate-shaped member and a backward posture in which the entire guide member is located within a predetermined range extending in a direction perpendicular to said one flat plane.

18. The end effector device according to claim 15, wherein rotation directions of at least two out of the plurality of rotating members are opposite to each other when changing the intervals of the plurality of plate-shaped members.

19. The end effector device according to claim 15, wherein the plurality of rotating members rotate in the same direction when changing the intervals of the plurality of plate-shaped members.

20. The end effector device according to claim 15, wherein the plurality of rotating members are rotated by one driving source.

21. The end effector device according to claim 20, wherein the driving source is provided closer to a base end portion of the robot arm than the blade.

22. The end effector device according to claim 20, wherein:
a virtual line passing through the driving source and connecting the base end portion and tip end portion of the blade does not pass through at least one of the pitch changing mechanisms; and
the driving source and said at least one of the pitch changing mechanisms are connected to each other by a universal joint.

23. The end effector device according to claim 15, wherein the plurality of pitch changing mechanisms are three pitch changing mechanisms provided on the blade so as to be spaced apart from one another.

24. An end effector device attached to a tip end portion of a robot arm,
the end effector device comprising:
a blade including a base end portion and a tip end portion; and
a support unit provided at the blade and configured to support peripheral portions of a plurality of plate-shaped members such that the plate-shaped members are parallel to one another and spaced apart from one another in an upper-lower direction and also configured to change intervals of the plate-shaped members,
wherein:
a plurality of pitch changing mechanisms are provided at the blade;
each of the plurality of pitch changing mechanisms includes holding portions, which are provided so as to be spaced apart from one another in a direction perpendicular to axes of the holding portions, each of the axes extending in one flat plane, and are configured to respectively hold peripheral portions of the plurality of plate-shaped members;

each of the plurality of pitch changing mechanisms changes intervals of the plurality of plate-shaped members, the intervals being formed in a direction perpendicular to said one flat plane;

at least one of the pitch changing mechanisms is provided at the support unit and is configured to move forward to the tip end portion of the blade and move backward to the base end portion of the blade;

said one of the pitch changing mechanisms holds the plate-shaped members at a position where said one of the pitch changing mechanisms has moved forward to the tip end portion of the blade and releases the plate-shaped members at a position where said one of the pitch changing mechanisms has moved backward to the base end portion of the blade;

the end effector device further comprises a guide member provided at the blade and configured to take a forward posture in which a guide surface of the guide member is located in the vicinity of a side edge of the plate-shaped member and a backward posture in which the entire guide member is located within a predetermined range extending in a direction perpendicular to said one flat plane; and the guide member is a guide pin including a base end portion coupled to the blade such that the guide pin is rotatable, the guide pin being configured to be rotatable between a standing posture and a prone posture, the standing posture being the forward posture in which the guide pin stands such that a peripheral surface thereof is located in the vicinity of the side edge of the plate-shaped member, the prone posture being the backward posture in which the guide pin is prone so as to be located within the predetermined range.

25. An end effector device attached to a tip end portion of a robot arm, the end effector device comprising:

a blade including a base end portion and a tip end portion; and a support unit provided at the blade and configured to support peripheral portions of a plurality of plate-shaped members such that the plate-shaped members are parallel to one another and spaced apart from one another in an upper-lower direction and also configured to change intervals of the plate-shaped members, wherein:

a plurality of pitch changing mechanisms are provided at the blade;

each of the plurality of pitch changing mechanisms includes holding portions, which are provided so as to be spaced apart from one another in a direction perpendicular to axes of the holding portions, each of the axes extending in one flat plane, and are configured to respectively hold peripheral portions of the plurality of plate-shaped members;

each of the plurality of pitch changing mechanisms changes intervals of the plurality of plate-shaped members, the intervals being formed in a direction perpendicular to said one flat plane;

at least one of the pitch changing mechanisms is provided at the support unit and is configured to move forward to the tip end portion of the blade and move backward to the base end portion of the blade;

said one of the pitch changing mechanisms holds the plate-shaped members at a position where said one of the pitch changing mechanisms has moved forward to the tip end portion of the blade and releases the plate-shaped members at a position where said one of the pitch changing mechanisms has moved backward to the base end portion of the blade;

the plurality of holding portions are provided on the pitch changing mechanism so as to be lined up in the upper-lower direction;

each of the holding portions includes
- a first oblique surface that is inclined inward and downward, and
- a second oblique surface that is formed at a lower side of the first oblique surface, is continuous with the first oblique surface, is inclined inward and downward, and has an inclination angle smaller than that of the first oblique surface; and the peripheral portion of the plate-shaped member is placed at and held by a boundary between the first oblique surface and the second oblique surface at an inner side of the holding portion.

* * * * *